US007564392B2

(12) United States Patent
Takabayashi

(10) Patent No.: US 7,564,392 B2
(45) Date of Patent: Jul. 21, 2009

(54) DECODER CIRCUIT

(75) Inventor: Yasutaka Takabayashi, Yamamashi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/138,674

(22) Filed: Jun. 13, 2008

(65) Prior Publication Data

US 2008/0246514 A1 Oct. 9, 2008

Related U.S. Application Data

(62) Division of application No. 11/711,747, filed on Feb. 28, 2007, now Pat. No. 7,403,146.

(30) Foreign Application Priority Data

Mar. 31, 2006 (JP) ............................ 2006-098143

(51) Int. Cl.
*H03M 1/76* (2006.01)

(52) U.S. Cl. ...................................... 341/148; 341/133

(58) Field of Classification Search .......... 341/130–170
See application file for complete search history.

(56) References Cited

U.S. PATENT DOCUMENTS 6,417,827 B1 * 7/2002 Nagao et al. .................. 345/89
6,864,869 B2 * 3/2005 Udo et al. ..................... 345/89
7,126,518 B2 * 10/2006 Tsuchi ....................... 341/144
7,161,517 B1 * 1/2007 Yen et al. .................... 341/145
7,327,299 B2 2/2008 Yen et al.
7,403,146 B2 * 7/2008 Takabayashi ............... 341/148

FOREIGN PATENT DOCUMENTS

JP 10-143116 5/1998
JP 2000-183747 6/2000

* cited by examiner

*Primary Examiner*—Lam T Mai
(74) *Attorney, Agent, or Firm*—Volentine & Whitt, PLLC

(57) ABSTRACT

A decoder circuit that selects a grayscale voltage responsive to digital input includes a first transistor circuit that selects grayscale voltages greater than a certain voltage and a second transistor circuit that selects grayscale voltages less than the certain voltage. The two transistor circuits are formed in separate substrates, one substrate being a well formed in the other substrate, or both substrates being wells formed in a third substrate. The substrate of the first transistor circuit is biased at a higher potential than the substrate of the second transistor circuit. This biasing scheme enables all selected grayscale voltages to propagate quickly through the decoder circuit.

9 Claims, 22 Drawing Sheets

FIG.3
PRIOR ART

| INPUT CODE (HEX) | G3 | G2 | G1 | G0 | G3B | G2B | G1B | G0B | OUT |
|---|---|---|---|---|---|---|---|---|---|
| 0h | 0 | 0 | 0 | 0 | 1 | 1 | 1 | 1 | VH0 |
| 1h | 0 | 0 | 0 | 1 | 1 | 1 | 1 | 0 | VH1 |
| 2h | 0 | 0 | 1 | 0 | 1 | 1 | 0 | 1 | VH2 |
| 3h | 0 | 0 | 1 | 1 | 1 | 1 | 0 | 0 | VH3 |
| 4h | 0 | 1 | 0 | 0 | 1 | 0 | 1 | 1 | VH4 |
| 5h | 0 | 1 | 0 | 1 | 1 | 0 | 1 | 0 | VH5 |
| 6h | 0 | 1 | 1 | 0 | 1 | 0 | 0 | 1 | VH6 |
| 7h | 0 | 1 | 1 | 1 | 1 | 0 | 0 | 0 | VH7 |
| 8h | 1 | 0 | 0 | 0 | 0 | 1 | 1 | 1 | VH8 |
| 9h | 1 | 0 | 0 | 1 | 0 | 1 | 1 | 0 | VH9 |
| Ah | 1 | 0 | 1 | 0 | 0 | 1 | 0 | 1 | VH10 |
| Bh | 1 | 0 | 1 | 1 | 0 | 1 | 0 | 0 | VH11 |
| Ch | 1 | 1 | 0 | 0 | 0 | 0 | 1 | 1 | VH12 |
| Dh | 1 | 1 | 0 | 1 | 0 | 0 | 1 | 0 | VH13 |
| Eh | 1 | 1 | 1 | 0 | 0 | 0 | 0 | 1 | VH14 |
| Fh | 1 | 1 | 1 | 1 | 0 | 0 | 0 | 0 | VH15 |

FIG.4
PRIOR ART

| INPUT CODE (HEX) | G7 | G6 | G5 | G4 | G3 | G2 | G1 | G0 | G7B | G6B | G5B | G4B | G3B | G2B | G1B | G0B | OUT |
|---|---|---|---|---|---|---|---|---|---|---|---|---|---|---|---|---|---|
| 00h | 0 | 0 | 0 | 0 | 0 | 0 | 0 | 0 | 1 | 1 | 1 | 1 | 1 | 1 | 1 | 1 | VH0 |
| 01h | 0 | 0 | 0 | 0 | 0 | 0 | 0 | 1 | 1 | 1 | 1 | 1 | 1 | 1 | 1 | 0 | VH1 |
| 02h | 0 | 0 | 0 | 0 | 0 | 0 | 1 | 0 | 1 | 1 | 1 | 1 | 1 | 1 | 0 | 1 | VH2 |
| 03h | 0 | 0 | 0 | 0 | 0 | 0 | 1 | 1 | 1 | 1 | 1 | 1 | 1 | 1 | 0 | 0 | VH3 |
| 04h | 0 | 0 | 0 | 0 | 0 | 1 | 0 | 0 | 1 | 1 | 1 | 1 | 1 | 0 | 1 | 1 | VH4 |
| 05h | 0 | 0 | 0 | 0 | 0 | 1 | 0 | 1 | 1 | 1 | 1 | 1 | 1 | 0 | 1 | 0 | VH5 |
| 06h | 0 | 0 | 0 | 0 | 0 | 1 | 1 | 0 | 1 | 1 | 1 | 1 | 1 | 0 | 0 | 1 | VH6 |
| 07h | 0 | 0 | 0 | 0 | 0 | 1 | 1 | 1 | 1 | 1 | 1 | 1 | 1 | 0 | 0 | 0 | VH7 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
| 1Ch | 0 | 0 | 0 | 1 | 1 | 1 | 0 | 0 | 1 | 1 | 1 | 0 | 0 | 0 | 1 | 1 | VH28 |
| 1Dh | 0 | 0 | 0 | 1 | 1 | 1 | 0 | 1 | 1 | 1 | 1 | 0 | 0 | 0 | 1 | 0 | VH29 |
| 1Eh | 0 | 0 | 0 | 1 | 1 | 1 | 1 | 0 | 1 | 1 | 1 | 0 | 0 | 0 | 0 | 1 | VH30 |
| 1Fh | 0 | 0 | 0 | 1 | 1 | 1 | 1 | 1 | 1 | 1 | 1 | 0 | 0 | 0 | 0 | 0 | VH31 |
| 20h | 0 | 0 | 1 | 0 | 0 | 0 | 0 | 0 | 1 | 1 | 0 | 1 | 1 | 1 | 1 | 1 | VH32 |
| 21h | 0 | 0 | 1 | 0 | 0 | 0 | 0 | 1 | 1 | 1 | 0 | 1 | 1 | 1 | 1 | 0 | VH33 |
| 22h | 0 | 0 | 1 | 0 | 0 | 0 | 1 | 0 | 1 | 1 | 0 | 1 | 1 | 1 | 0 | 1 | VH34 |
| 23h | 0 | 0 | 1 | 0 | 0 | 0 | 1 | 1 | 1 | 1 | 0 | 1 | 1 | 1 | 0 | 0 | VH35 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
| 7Ch | 0 | 1 | 1 | 1 | 1 | 1 | 0 | 0 | 1 | 0 | 0 | 0 | 0 | 0 | 1 | 1 | VH124 |
| 7Dh | 0 | 1 | 1 | 1 | 1 | 1 | 0 | 1 | 1 | 0 | 0 | 0 | 0 | 0 | 1 | 0 | VH125 |
| 7Eh | 0 | 1 | 1 | 1 | 1 | 1 | 1 | 0 | 1 | 0 | 0 | 0 | 0 | 0 | 0 | 1 | VH126 |
| 7Fh | 0 | 1 | 1 | 1 | 1 | 1 | 1 | 1 | 1 | 0 | 0 | 0 | 0 | 0 | 0 | 0 | VH127 |
| 80h | 1 | 0 | 0 | 0 | 0 | 0 | 0 | 0 | 0 | 1 | 1 | 1 | 1 | 1 | 1 | 1 | VH128 |
| 81h | 1 | 0 | 0 | 0 | 0 | 0 | 0 | 1 | 0 | 1 | 1 | 1 | 1 | 1 | 1 | 0 | VH129 |
| 82h | 1 | 0 | 0 | 0 | 0 | 0 | 1 | 0 | 0 | 1 | 1 | 1 | 1 | 1 | 0 | 1 | VH130 |
| 83h | 1 | 0 | 0 | 0 | 0 | 0 | 1 | 1 | 0 | 1 | 1 | 1 | 1 | 1 | 0 | 0 | VH131 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
| F8h | 1 | 1 | 1 | 1 | 1 | 0 | 0 | 0 | 0 | 0 | 0 | 0 | 0 | 1 | 1 | 1 | VH248 |
| F9h | 1 | 1 | 1 | 1 | 1 | 0 | 0 | 1 | 0 | 0 | 0 | 0 | 0 | 1 | 1 | 0 | VH249 |
| FAh | 1 | 1 | 1 | 1 | 1 | 0 | 1 | 0 | 0 | 0 | 0 | 0 | 0 | 1 | 0 | 1 | VH250 |
| FBh | 1 | 1 | 1 | 1 | 1 | 0 | 1 | 1 | 0 | 0 | 0 | 0 | 0 | 1 | 0 | 0 | VH251 |
| FCh | 1 | 1 | 1 | 1 | 1 | 1 | 0 | 0 | 0 | 0 | 0 | 0 | 0 | 0 | 1 | 1 | VH252 |
| FDh | 1 | 1 | 1 | 1 | 1 | 1 | 0 | 1 | 0 | 0 | 0 | 0 | 0 | 0 | 1 | 0 | VH253 |
| FEh | 1 | 1 | 1 | 1 | 1 | 1 | 1 | 0 | 0 | 0 | 0 | 0 | 0 | 0 | 0 | 1 | VH254 |
| FFh | 1 | 1 | 1 | 1 | 1 | 1 | 1 | 1 | 0 | 0 | 0 | 0 | 0 | 0 | 0 | 0 | VH255 |

DECODER CIRCUIT

CROSS-REFERENCE TO RELATED APPLICATIONS

This is a divisional of application Ser. No. 11/711,747, filed Feb. 28, 2007, which is incorporated herein by reference in its entirety.

BACKGROUND OF THE INVENTION

1. Field of the Invention

The present invention relates to a decoder circuit for selecting an analog voltage such as an analog grayscale voltage for a liquid crystal display.

2. Description of the Related Art

A thin-film-transistor (TFT) liquid crystal display generally includes a microelectronic chip, sometimes referred to as a source driver chip, that receives and decodes an m-bit input signal in order to select and output one of 2m positive and 2m negative analog grayscale voltages. The output voltage is supplied to the source electrodes of transistors in the display.

FIGS. 1 and 2 show examples of conventional decoder circuits used for output of positive voltages in a source driver chip. These circuits comprise p-channel metal-oxide-semiconductor (PMOS) transistors formed in an n-type well or n-well 10 biased at the positive power supply potential (VDD). The analog grayscale voltages are generated by a resistor ladder (not shown). Although typical values of m are six to ten, enabling the circuit to select from sixty-four (26) to one thousand twenty-four (210) analog voltage levels, circuits with four-bit and eight-bit input are shown for simplicity.

FIG. 1 shows a four-bit decoder circuit that selects and outputs one of sixteen analog grayscale voltages according to the combination of four input bit signals. Inverters 10, 11, 12, 13 invert the input signals: inverter 10 is coupled between an input node G0 and an output node G0B, inverter 11 is coupled between an input node G1 and an output node G1B, inverter 12 is coupled between an input node G2 and an output node G2B, and inverter 13 is coupled between an input node G3 and an output node G3B.

Nodes VH0 to VH15, which receive the sixteen analog grayscale voltages, are connected to the source electrodes of PMOS transistors P0_0 to P0_15. The gate electrodes of the even-numbered transistors P0_0, P0_2, P0_4, P0_6, P0_8, P0_10, P0_12, P0_14 are connected to node G0. The gate electrodes of the odd-numbered PMOS transistors P0_1, P0_3, P0_5, P0_7, P0_9, P0_11, P0_13, P0_15 are connected to node G0B.

A node Net1_0 is connected to the drain electrodes of transistors P0_0, P0_1 and the source electrode of transistor P1_0. A node Net1_1 is connected to the drain electrodes of transistors P0_2, P0_3 and the source electrode of transistor P1_1. A node Net1_2 is connected to the drain electrodes of transistors P0_4, P0_5 and the source electrode of transistor P1_2. A node Net1_3 is connected to the drain electrodes of transistors P0_6, P0_7 and the source electrode of transistor P1_3. A node Net1_4 is connected to the drain electrodes of transistors P0_8, P0_9 and the source electrode of transistor P1_4. A node Net1_5 is connected to the drain electrodes of transistors P0_10, P0_11 and the source electrode of transistor P1_5. A node Net1_6 is connected to the drain electrodes of transistors P0_12, P0_13 and the source electrode of transistor P1_6. A node Net1_7 is connected to the drain electrodes of transistors P0_14, P0_15 and the source electrode of transistor P1_7.

Among transistors P1_0 to P1_7, the gate electrodes of the even-numbered transistors P1_0, P1_2, P1_4, P1_6 are connected to node G1 and the gate electrodes of the odd-numbered transistors P1_1, P1_3, P1_5, P1_7 are connected to node G1B. A node Net2_0 is connected to the drain electrodes of transistors P1_0, P1_1 and the source electrode of transistor P2_0. A node Net2_1 is connected to the drain electrodes of transistors P1_2, P1_3 and the source electrode of transistor P2_1. A node Net2_2 is connected to the drain electrodes of transistors P1_4, P1_5 and the source electrode of transistor P2_2. A node Net2_3 is connected to the drain electrodes of transistors P1_6, P1_7 and the source electrode of transistor P2_3. Among transistors P2_0 to P2_3, the gate electrodes of the even-numbered transistors P2_0, P2_2 are connected to node G2 and the gate electrodes of the odd-numbered PMOS transistors P2_1, P2_3 are connected to node G2B. A node Net3_0 is connected to the drain electrodes of transistors P2_0, P2_1 and the source electrode of transistor P3_0. A node Net3_1 is connected to the drain electrodes of transistors P2_2, P2_3 and the source electrode of transistor P3_1. The gate electrodes of transistor P3_0 and transistor P3_1 are connected to node G3 and node G3B, respectively. An output node OUT is connected to the drain electrodes of transistors P3_0, P3_1. The transistors are accordingly connected in a tree structure with the output node OUT as the root node.

The n-well 10 in which transistors P0_0 to P0_15, P1_0 to P1_7, P2_0 to P2_3, P3_0, and P3_1 are formed is connected at one or more points to a power supply node and held at a power supply potential VDD equal to or greater than the highest of the analog grayscale voltage levels at nodes VH0 to VH15.

In this circuit, the states of the output node OUT depend on the combinations of the logical states of nodes G0 to G3 as shown in FIG. 3. That is, one of the sixteen voltage levels at nodes VH0 to VH15 is selected and output to the output node OUT according to the combination of the states of nodes G0 to G3, which are indicated individually in FIG. 3 and also as a hexadecimal (HEX) input code. When nodes G0 to G3 are all at the low or '0' logic level, for example, transistors P0_0, P1_0, P2_0, and P3_0 are all turned on, so that the voltage level at node VH0 is output to the output node OUT. The other voltage levels at nodes VH1 to VH15 do not propagate to the output node OUT because the gate electrode of at least one of the transistors on each of the paths from nodes VH1 to VH15 to the output node OUT is at the high or '1' logic level and the relevant transistor is turned off.

FIG. 2 shows an eight-bit decoder circuit that selects and outputs one of two hundred fifty-six analog grayscale voltages (received at nodes VH0 to VH255) according to the states of eight input signals (received at nodes G0 to G7). The increased number of input signals and analog grayscale voltages and the resulting increased number of transistors cannot all be shown in the drawing, but the circuit configuration follows the same plan as in FIG. 1.

In the circuit shown in FIG. 2, the states of the output node OUT depend on the combination of the logical states of nodes G0 to G7 as shown in FIG. 4. For each combination, one of the two hundred fifty-six voltage levels at nodes VH0 to VH255 is selected and output at the output node OUT. When nodes G0 to G7 are all at the '0' logic level (the input code is hexadecimal 00h), for example, transistors P0_0, P1_0, P2_0, P3_0, P4_0, P5_0, P6_0, P7_0 are all turned on and the voltage level at node VH0 is output to the output node OUT. The other voltage levels at nodes VH1 to VH255 do not propagate to the output node OUT because the gate electrode of at least one of the transistors on each path from nodes VH1 to VH255 to the output node OUT is at the '1' logic level and the relevant transistor is turned off.

Further details of the circuits in FIGS. 1 and 2 can be found in Japanese Patent Application Publication No. 2000-183747, which discloses a resistor ladder for generating a plurality of grayscale voltages and a selection circuit for selecting one of the grayscale voltages output from the resistor ladder.

A problem with the above circuit configuration is that when the selected analog grayscale voltage is much lower than the substrate (n-well) voltage of the PMOS transistors, a comparatively long selection time becomes necessary, degrading the response speed of the circuit, and in some cases the expected analog grayscale voltage level is not obtained.

FIG. 5 is a graph illustrating current characteristics of a typical PMOS transistor. The horizontal axis indicates the gate-source voltage VGS, that is, the gate potential minus the source potential. The horizontal axis indicates the drain current IDS, that is, the current flowing from the source terminal to the drain terminal. The multiple curves correspond to different values of the substrate-source voltage VBS, which is the substrate potential minus the source potential. The arrow indicates the direction of increasing substrate-source voltage VBS. It can be seen that the drain current IDS decreases not only with increasing gate-source voltage VGS, but also with increasing substrate-source voltage VBS.

FIG. 6 is an exemplary graph illustrating the analog grayscale voltages corresponding to the eight-bit input codes in the eight-bit decoder circuit shown in FIG. 2. The two hundred fifty-six analog grayscale voltages are related as follows:

$$VH255>VH254>VH253> \ldots >VH2>VH1>VH0$$

Voltage VH255 is the highest level, closest to the power supply potential VDD, and voltage VH0 is the lowest level. When transistors P0_0 and P0_255 are selected, voltages are applied to their terminals as shown in FIGS. 7 and 8. In this case, if the gate-source voltages VGS of transistors P0_255 and P0_0 are denoted VGS_255 and VGS_0, respectively, and their substrate-source voltages VBS are denoted VBS_255 and VBS_0, these voltages are given by the following equations:

$$VGS\_255=0(\text{ground level})-VH255=-VH255$$

$$VBS\_255=VDD-VH255$$

$$VGS\_0=0(\text{ground level})-VH0=-VH0$$

$$VBS\_0=VDD-VH0$$

A source driver for driving a TFT liquid crystal typically has a positive analog grayscale voltage range from about (½)·VDD to VDD−0.2 volts. If voltages VH255 and VH0 are set to these values (VH255=VDD−0.2 and VH0=(½)·VDD), the above equations become:

$$VGS\_255=-VH255=0.2-VDD$$

$$VBS\_255=VDD-VH255=0.2$$

$$VGS\_0=-VH0=-(1/2)\cdot VDD$$

$$VBS\_0=VDD-VH0=(1/2)\cdot VDD$$

Under these conditions, if the operating point of transistor P0_255 is indicated by point A in FIG. 5, the operating point of transistor P0_0 is at point B. The drain current IDS at point B is significantly less than the drain current IDS at point A. That is, the current IDS that flows when analog grayscale voltage VH0 is selected is significantly less than the current IDS that flows when analog grayscale voltage VH255 is selected, and this difference shows up in the response times of these decoder circuit during the selection period.

When the two hundred fifty-six analog grayscale voltages decrease in sequence from VH255 to VH0 (VH255>VH254>VH253> . . . >VH2>VH1>VH0) as shown in FIG. 6, if the gate-source voltage VGS and substrate-source voltage VBS applied when transistors P0_255 to P0_0 are selected are denoted VGS_255 to VGS_0 and VBS_255 to VBS_0, respectively, these voltage are related as follows:

$$VGS\_255<VGS\_254<VGS\_253< \ldots <VGS\_2<VGS\_1<VGS\_0$$

$$VBS\_255<VBS\_254<VBS\_253< \ldots <VBS\_2<VBS\_1<VBS\_0$$

If the drain currents IDS of transistors P0_255 to P0_0 are denoted IDS_255 to IDS_0, then from the graph in FIG. 5, these currents are related as follows, illustrating one of the characteristics of a PMOS transistor:

$$IDS\_255>IDS\_254>IDS\_253> \ldots >IDS\_2>IDS\_1>IDS\_0$$

This indicates that the higher the analog grayscale voltage is, the larger the current becomes, and the lower the analog grayscale voltage is, the smaller the current becomes. The response time of a transistor decreases as the current flowing through it increases, so if the response times of transistors P0_255 to P0_0 are denoted T255A to T0A, they are related as follows:

$$T255A<T254A<T253A< \ldots <T2A<T1A<T0A$$

This indicates that the higher the analog grayscale voltage is, the shorter the response time becomes, and the lower the analog grayscale voltage is, the longer the response time becomes. FIG. 9 is a timing diagram illustrating the response at the output node OUT when analog grayscale voltages VH255 and VH127 are selected repeatedly in alternation. The analog grayscale voltages selected according to the input codes correspond to those shown in FIG. 4.

The notation TMAX in FIG. 9 indicates the maximum allowable response time. When the voltage at the output node OUT does not reach the selected analog grayscale voltage level within this time, a liquid crystal display fault such as a bright or dark line or an irregular color may appear.

From the relationship $T255A<T254A<T253A< \ldots <T2A<T1A<T0A$, the response time at the output node OUT is the shortest when analog grayscale voltage VH255 is selected, and is longer when other analog grayscale voltages are selected. The output node OUT reaches voltage level VH255 quickly, and response time T255A is sufficiently shorter than TMAX that no display fault occurs.

When analog grayscale voltage VH127 is selected, the voltages VGS, VBS are given as follows:

$$VGS=-VH127,\ VBS=VDD-VH127$$

Assuming from the grayscale voltage graph in FIG. 6 that the analog grayscale voltage VH127 is set such that VH127=(¾)·VDD, the above voltages VGS, VBS can be expressed as follows:

$$VGS=-(3/4)\cdot VDD,\ VBS=(1/4)\cdot VDD$$

The current IDS in this case, which is given by point C in FIG. 5, is about half the current IDS that flows when analog grayscale voltage VH255 is selected. Therefore, the response time at the output node OUT is approximately doubled, but the output node OUT still reaches voltage level VH127 within a time not exceeding TMAX.

FIG. 10 is a timing diagram illustrating alternate selection of analog grayscale voltages VH255 and VH7 and the resulting response waveform at the output node OUT. Since the current IDS that flows when voltage VH7 is selected approaches the current at point B in FIG. 5, the response time T7A at the output node OUT becomes much longer than the response time T127A. The output node OUT now needs nearly the whole of time TMAX to reach voltage level VH7, but since the condition T7A<TMAX is still met, no display fault occurs.

FIG. 11 is a timing diagram illustrating alternate selection of the analog grayscale voltages VH255 and VH0 and the resulting response waveform at the output node OUT. Since the current IDS that flows when voltage VH0 is selected is given by point B in FIG. 5, it is very greatly decreased, and the response time T0A at the output node OUT becomes even longer than response time T7A, exceeding the allowable time TMAX. In this case, since the output node OUT fails to reach the selected analog grayscale voltage level VH0 within the necessary time, the liquid crystal display cannot display the expected color, which may cause display faults such as, for example, a bright or dark line or an irregular color. Furthermore, if the analog grayscale voltage range is widened and voltage level VH0 is further decreased, or if the VGS and VBS characteristics of the PMOS transistors are degraded, the operating point when voltage VH0 is selected may move from the point B to point D in FIG. 5. At point D the gate-source voltage VGS fails to exceed the PMOS transistor threshold voltage (VTH), so the current IDS falls to substantially zero.

FIG. 12 is a timing diagram illustrating the response waveform at the output node OUT when the transistors operate at point D in FIG. 5. When the selection is changed from voltage VH255 to voltage VH0, the output node OUT begins to approach voltage level VH0, but then the gate-source voltage VGS of transistor P0_0 crosses the PMOS transistor threshold voltage (VTH), so transistor P0_0 turns off before the output node OUT reaches voltage level VH0. Therefore, the output voltage level at the output node OUT cannot reach voltage level VH0 even after an indefinitely long time.

As described above, in the conventional circuit, the voltages VGS and VBS increase as the selected analog grayscale voltage decreases, which may lead to a great reduction in current flow through the transistors in the decoder circuit. Resulting problems are that the selected analog grayscale voltage cannot be output within the necessary time, and in some cases cannot be output at all.

SUMMARY OF THE INVENTION

An object of the present invention is to provide a decoder circuit that can conduct all selected grayscale voltages to its output terminal quickly.

The invented decoder circuit has a plurality of grayscale voltage input terminals for receiving respective grayscale voltages, a plurality of digital signal input terminals receiving respective bit signals, a first selection circuit, a second selection circuit, and an output terminal. The grayscale voltages are divided into a first group and a second group, the grayscale voltages in the first group being higher than the grayscale voltages in the second group.

The first selection circuit has a plurality of transistors interconnected to select grayscale voltages in the first group responsive to the bit signals, and conduct the selected grayscale voltage to the output terminal. The second selection circuit has a plurality of transistors interconnected to select grayscale voltages in the second group responsive to the bit signals, and conduct the selected grayscale voltage to the output terminal. The transistors in the first selection circuit operate in a first substrate biased at a first potential. The transistors in the second selection circuit operate in a second substrate biased at a second potential lower than the first potential.

In one aspect of the invention, the transistors in the first selection circuit are p-channel transistors and the transistors in the second selection circuit are n-channel transistors. The first substrate may be an n-well formed in the second substrate, or the second substrate may be a p-well formed in the first substrate.

In another aspect of the invention, the transistors in the first and second selection circuits are all of the same type. The first and second substrates may be wells formed in a third substrate.

Biasing the two substrates at different potentials enables voltages at both the high and low ends of the grayscale to propagate quickly through the decoder circuit.

BRIEF DESCRIPTION OF THE DRAWINGS

In the attached drawings:

FIG. 3 is a table of input codes and output voltages in a four-bit decoder circuit.

FIG. 4 is a table of input codes and output voltages in an eight-bit decoder circuit.

DETAILED DESCRIPTION OF THE INVENTION

Figure 1:
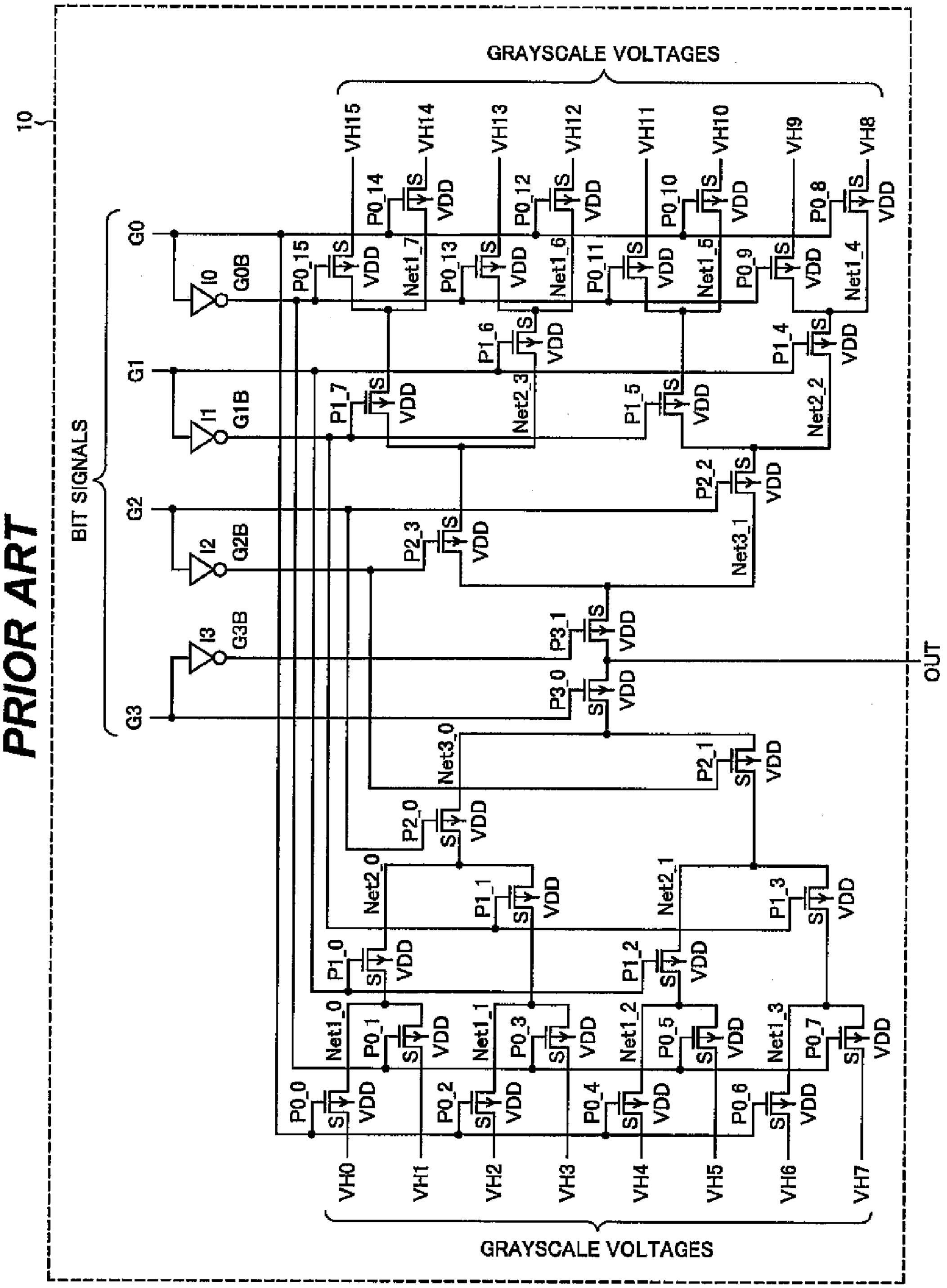
FIG.1 PRIOR ART
FIG. 1 is a circuit diagram of a conventional four-bit decoder circuit.

Embodiments of the invention will now be described with reference to the attached drawings, in which like elements are indicated by like reference characters. The terms 'terminal' and 'node' will be used interchangeably.

First Embodiment

The first embodiment is based on a conventional eight-bit decoder circuit in which the lowest eight analog grayscale voltages VH0 to VH7 fail to propagate to the output node within the necessary time TMAX. The modifications introduced by the first embodiment ensure that all of the analog grayscale voltages VH0 to VH255 reach the output node within time TMAX. Analog grayscale voltages VH8 to VH255 constitute the first group of grayscale voltages in the first embodiment, while VH0 to VH7 constitute the second group.

Figure 2:
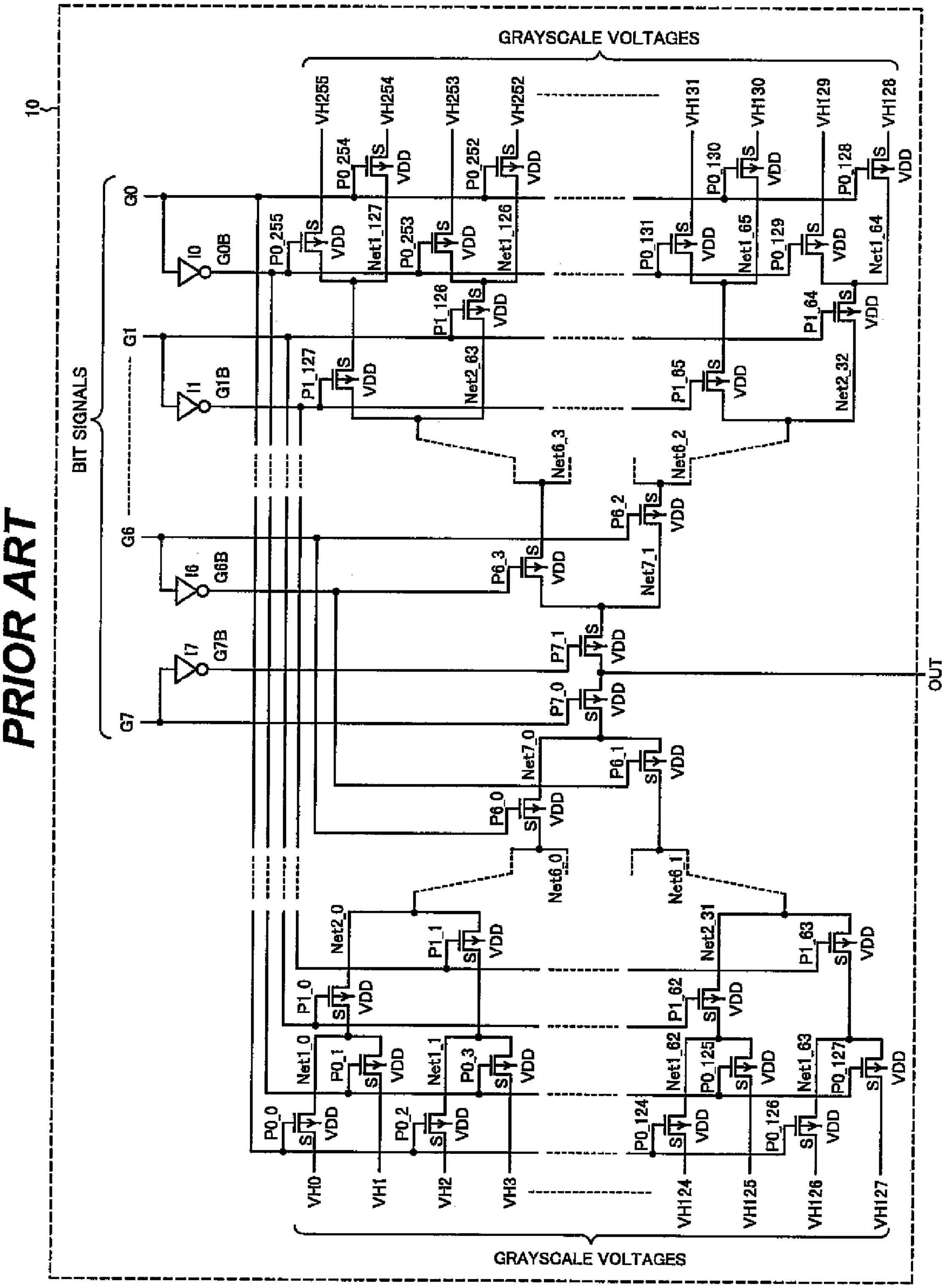
FIG.2 PRIOR ART
FIG. 2 is a circuit diagram of a conventional eight-bit decoder circuit.
Figure 13:
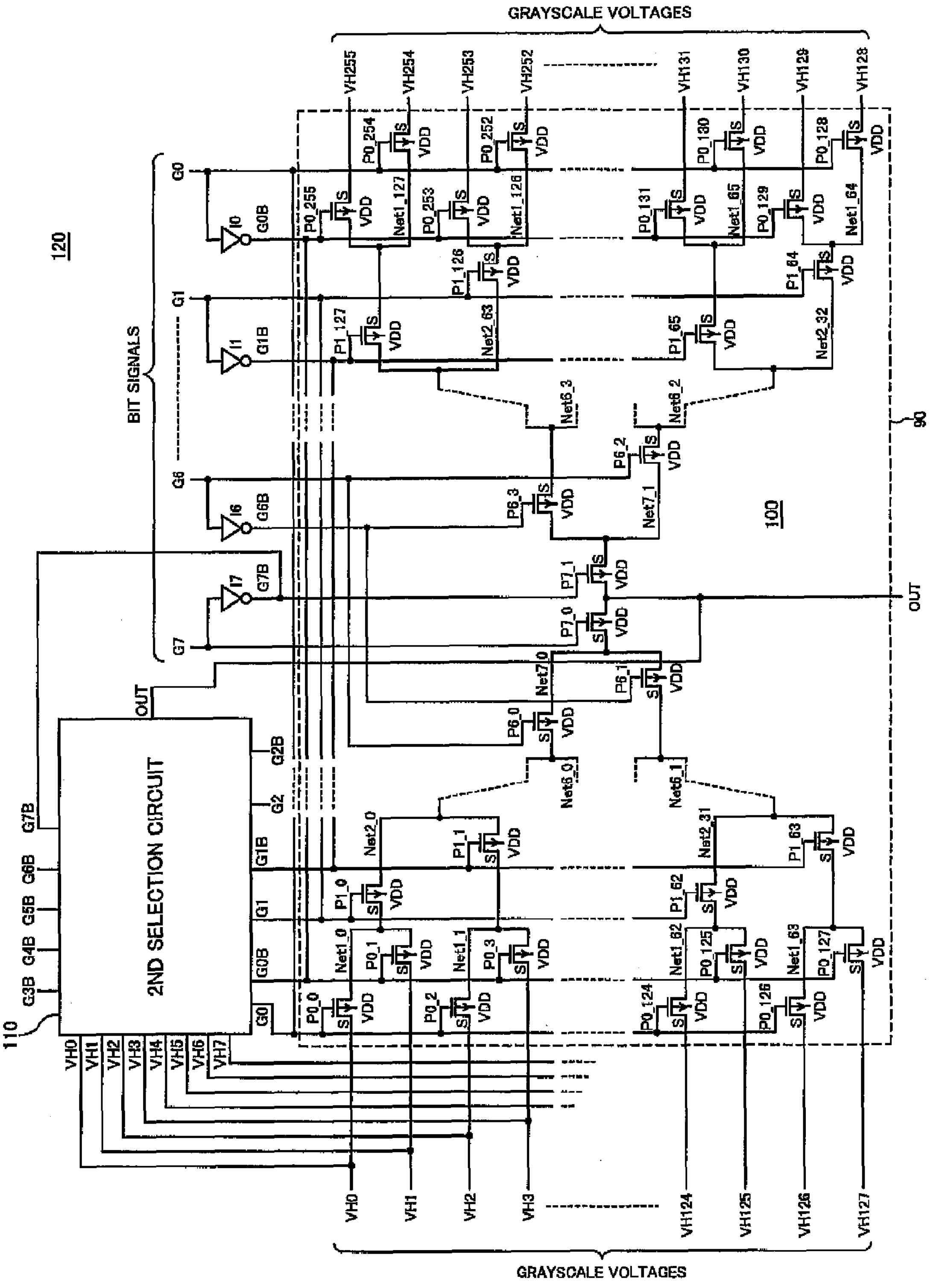
FIG. 13 is a circuit diagram of an eight-bit decoder circuit according to a first embodiment of the invention.

Referring to FIG. 13, the first embodiment adds a second selection circuit 110 comprising n-channel metal-oxide-semiconductor (NMOS) transistors to the decoder circuit shown in FIG. 2. The PMOS transistors, inverters, and nodes in FIG. 13 are designated by the same reference characters as in FIG. 2; a repeated description of their interconnections will be omitted.

The transistors shown in FIG. 13, which are PMOS transistors disposed in an n-type first substrate 90, constitute the first selection circuit 100. These PMOS transistors are interconnected in a tree configuration with the output terminal OUT of the decoder circuit as a root node and the analog grayscale voltage nodes VH0 to VH255 as leaf nodes. The first substrate 90 is an n-type well formed in a p-type second substrate 120. The p-type second substrate 120 in FIG. 13 occupies the area exterior to the first substrate 90. In particular, the second selection circuit 110 is formed in the second substrate 120.

The inverters 10, 11, . . . , 16, 17 that invert the bit signals are shown for convenience in the second substrate 120 together with the second selection circuit 110. The inverters may, however, include both NMOS transistors disposed in the p-type second substrate 120, and PMOS transistors disposed in the n-type first substrate 90, or in a separate n-well (not shown) in the second substrate 120.

Figure 14:
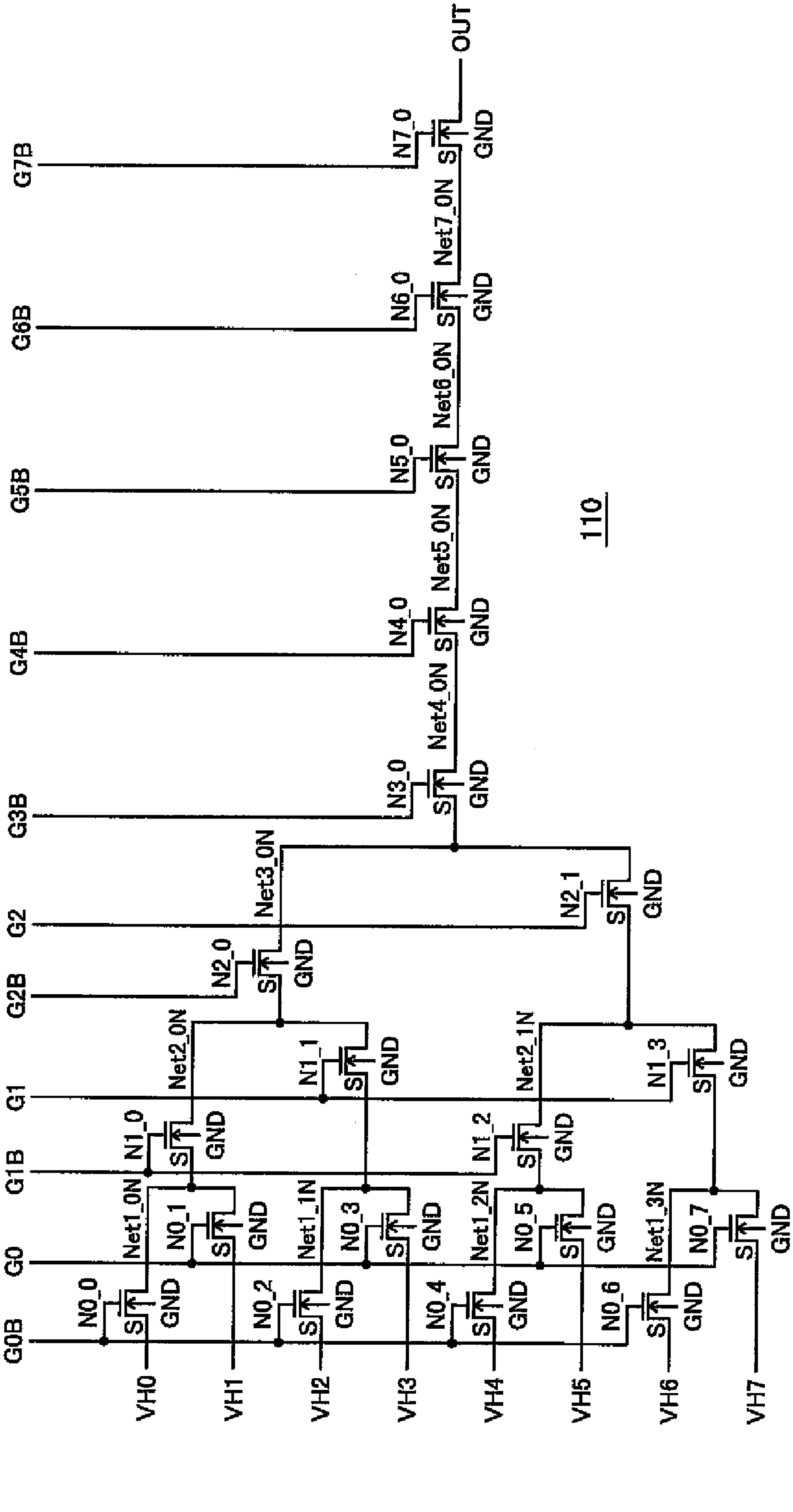
FIG. 14 is a circuit diagram of the second selection circuit in the first embodiment.

FIG. 14 is a circuit diagram illustrating the internal structure of the second selection circuit 110, comprising NMOS transistors N0_0 to N0_7, N1_0 to N1_3, N2_0, N2_1, N3_0, N4_0, N5_0, N6_0, and N7_0. Nodes VH0 to VH7 are connected to the source electrodes of NMOS transistors N0_0 to N0_7, respectively; the gate electrodes of the even-numbered transistors N0_0, N0_2, N0_4, N0_6 are connected to node G0B and the odd-numbered transistors N0_1, N0_3, N0_5, N0_7 to node G0. The drain electrodes of transistors N0_0, N0_1 and the source electrode of transistor N1_0 are connected to a node Net1_0N; the drain electrodes of transistors N0_2, NO_3 and the source electrode of transistor N1_1 are connected to a node Net1_1N; the drain electrodes of transistors N0_4, N0_5 and the source electrode of transistor N1_2 are connected to a node Net1_2N; and the drain electrodes of transistors N0_6, N0_7 and the source electrode of transistor N1_3 are connected to a node Net1_3N. The gate electrodes of transistors N1_0, N1_2 are connected to node G1B. The gate electrodes of transistors N1_1, N1_3 are connected to node G1. The drain electrodes of transistors N1_0, N1_1 and the source electrode of transistor N2_0 are connected to a node Net2_0N, and the drain electrodes of transistors N1_2, N1_3 and the source electrode of transistor N2_1 are connected to a node Net2_1N. The gates of transistor N2_0 and transistor N2_1 are connected to node G2B and node G2, respectively. The drain electrodes of transistors N2_0, N2_1 and the source electrode of transistor N3_0 are connected to a node Net3_0N. Transistor N3_0 has a gate electrode connected to node G3B and a drain electrode connected through a node Net4_0N to the source electrode of transistor N4_0. Transistor N4_0 has a gate electrode connected to node G4B and a drain electrode connected through a node Net5_0N to the source electrode of transistor N5_0. Transistor N5_0 has a gate electrode connected to node G5B and a drain electrode connected through a node Net6_0N to the source electrode of transistor N6_0. Transistor N6_0 has a gate electrode connected to node G6B and a drain electrode connected through a node Net7_0N to the source electrode of transistor N7_0. Transistor N7_0 has a gate electrode connected to node G7B and a drain electrode connected to the output terminal or node OUT. The substrate of all these NMOS transistors is connected to the ground level (GND).

The relationship between input codes and voltages at the output node OUT is as shown in FIG. 4. When the input code at nodes G0 to G7 is in the range from (in hexadecimal notation) 08h to FFh, selecting the first group of analog grayscale voltages from VH8 to VH255, since at least one of the five nodes G3B to G7B is at the '0' logic level, the voltages VH0 to VH7 are not output to the output node OUT through the NMOS transistors. In this range, the first selection circuit 100 operates in the same way as the conventional decoder circuit in FIG. 2.

When the input code at nodes G0 to G7 is in the range from 00h to F7h (hexadecimal), selecting the second group of analog grayscale voltages in the range from VH0 to VH7, a series of NMOS transistors coupled between one of nodes VH0 to VH7 and the output node OUT turn on, and the selected analog grayscale voltage is output to the output node OUT through this NMOS transistors series. At the same time, a series of PMOS transistors in the first selection circuit 100, which are coupled between one of nodes VH0 to VH7 and the output node OUT, also turn on, and the selected analog grayscale voltage is also output to the output node OUT through the PMOS transistors series. That is, when one of nodes VH0 to VH7 is selected, the selected analog grayscale voltage is output to the output node OUT from both the PMOS first selection circuit 100 and the NMOS second selection circuit 110. In other words, the first selection circuit 100 and second selection circuit 110 are coupled in parallel between the grayscale voltage input terminals and the output node OUT. If the input signals form an m-bit input code, the number of transistors in the series between each grayscale voltage input terminal and the output node OUT is m in both the first selection circuit 100 and the second selection circuit 110. This use of equal numbers of transistors simplifies the control of factors such as wiring resistance. In this configuration, the analog grayscale voltage propagating through the PMOS transistors is short-circuited to the analog grayscale voltage propagating through the NMOS transistors at the output node OUT. However, the nodes to which the gate electrodes of the novel NMOS transistors are connected have logic levels inverse to the logic levels of the nodes to which the gate electrodes of the corresponding PMOS transistors on the short-circuiting path, so the short circuit is always established with the same analog grayscale voltage at both ends, and therefore does not disturb the analog grayscale voltage.

When the input code is 00h, for example, nodes G0 to G7 are all at the '0' logic level whereas nodes G0B to G7B are all at the '1' logic level. In this case, among the transistors in FIG. 13, the series of transistors that are all turned on are the PMOS transistors P0_0 to P7_0 coupled in series between node VH0 and the output node OUT, and among the transistors in FIG. 14, the series of transistors that are all turned are the NMOS transistors N0_0 to N7_0 coupled in series between node VH0 and the output node OUT. Therefore, both the PMOS and NMOS series of transistors connect the same analog grayscale voltage input node (VH0) to the output node OUT.

The general IDS characteristics of NMOS transistors can be summarized as follows: as the gate-source voltage VGS decreases, the drain current IDS decreases; as VGS increases, IDS increases; as the substrate-source voltage VBS decreases, IDS decreases; and as VBS increases, IDS increases.

By way of example, the variations of the drain currents IDS of the PMOS and NMOS transistors will now be considered for two cases: one in which voltage VH0 is selected, and one in which voltage VH7 is selected, noting that VH0 is lower than VH7 (VH0<VH7).

The PMOS transistors have gate-source voltages VGS equal to −VH0 and substrate-source voltages VBS equal to VDD−VH0 when voltage VH0 is selected, and have VGS equal to−VH7 and VBS equal to VDD−VH7 when voltage VH7 is selected. From the above relationship (VH0<VH7), voltages VGS and VBS are both higher when VH0 is selected than when VH7 is selected. Accordingly, the drain current IDS is smaller when voltage VH0 is selected than when voltage VH7 is selected. The NMOS transistors have VGS equal to VDD−VH0 and VBS equal to −VH0 when voltage VH0 is selected, and have VGS equal to VDD−VH7 and VBS equal to −VH7 when voltage VH7 is selected. From the same relationship (VH0<VH7), voltages VGS and VBS are both higher when VH0 is selected than when VH7 is selected. Accordingly, the drain current IDS is greater when voltage VH0 is selected than when voltage VH7 is selected.

As described above, as the analog grayscale voltage decreases, the current IDS of the PMOS transistor decreases, whereas the current IDS of the NMOS transistor increases. Accordingly, as the analog grayscale voltage decreases, the increased drain current IDS of the NMOS transistors compensates for the decreased drain current IDS of the PMOS transistors.

Figure 15:
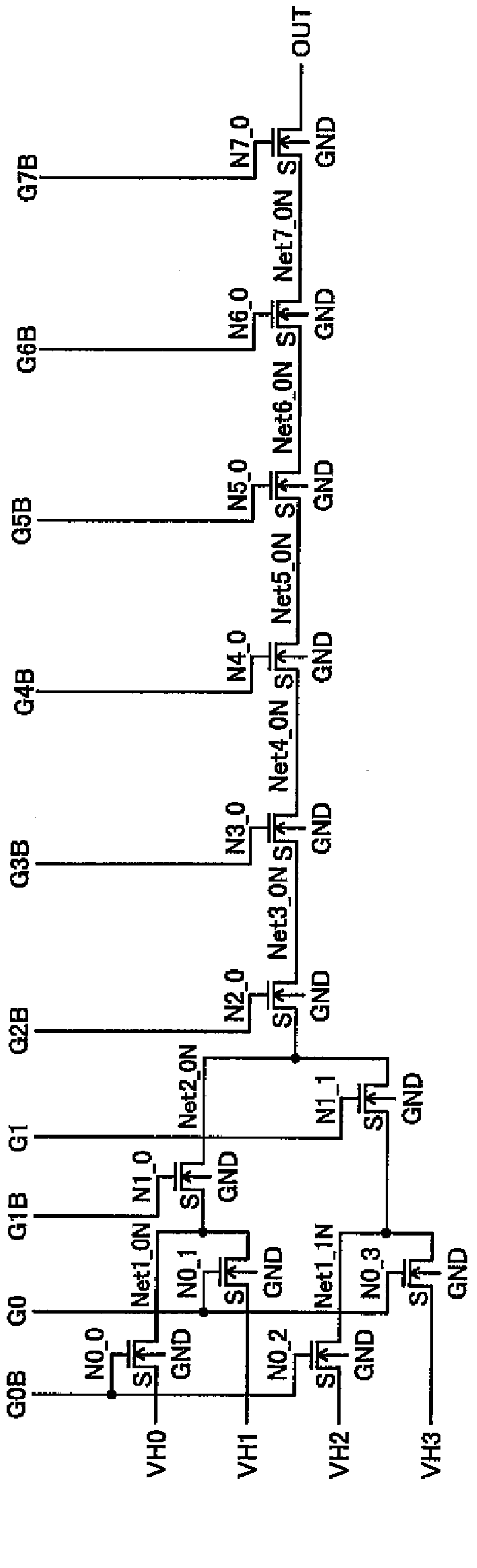
FIGS. 15 and 16 illustrate variations of the second selection circuit in the first embodiment.
Figure 16:
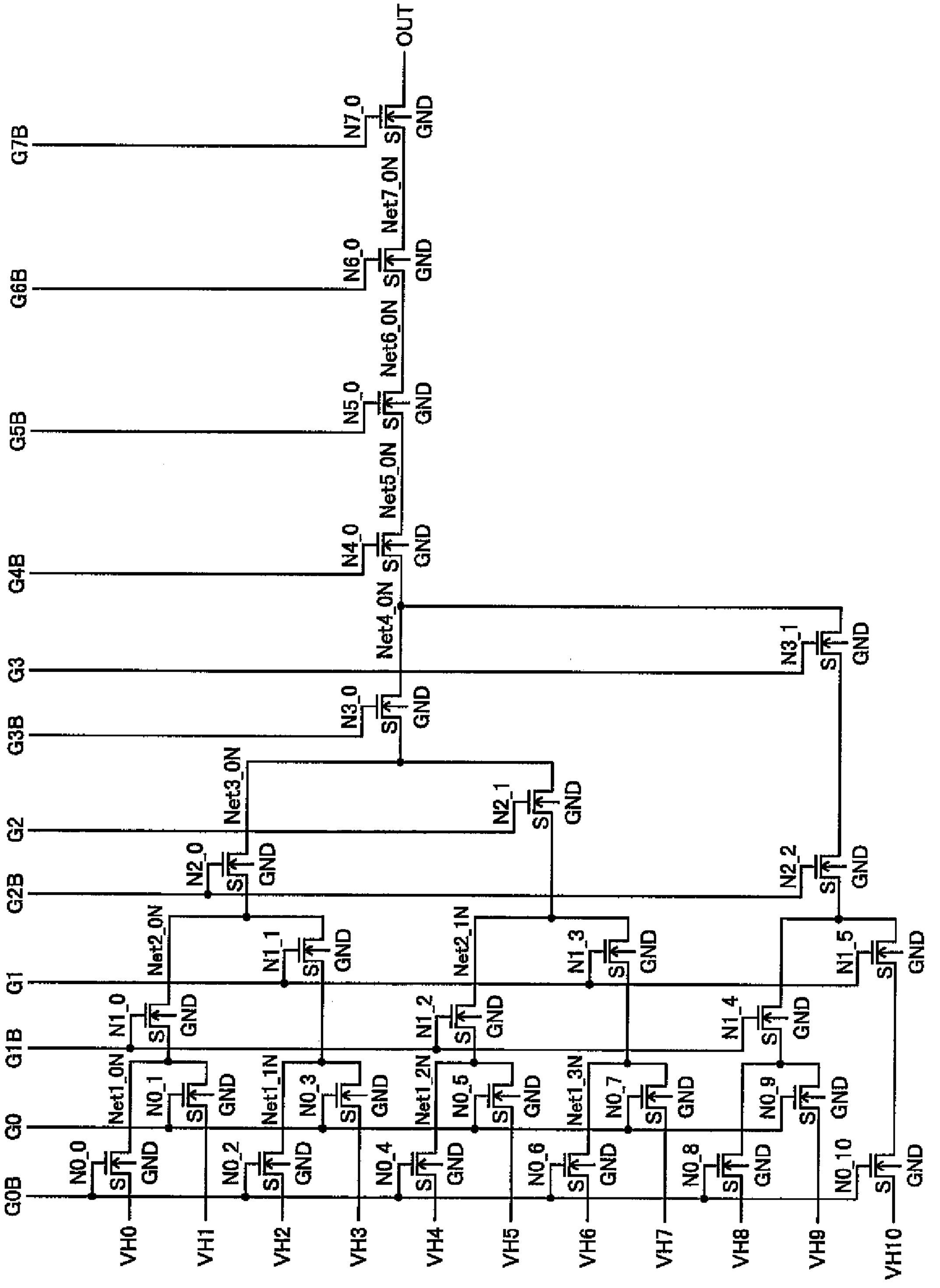

The first embodiment as shown in FIGS. 13 and 14 is designed to ensure that the lowest eight analog grayscale voltages VH0 to VH7 propagate to the output node OUT within the necessary time TMAX, the assumption being that this requirement would not be met by the first selection circuit 100 alone. If the group of analog grayscale voltages that fail to meet the time TMAX requirement is not the lowest eight but a different group of analog grayscale voltages, the first embodiment can modified by changing the input nodes of the second selection circuit 110 and connecting NMOS transistors to those nodes in a configuration similar to FIG. 14. Second selection circuits connected to the four nodes VH0 to VH3 and the eleven nodes VH0 to VH10 are shown in FIGS. 15 and 16 for reference.

As noted above, a TFT liquid crystal display generally requires grayscale voltages of both positive and negative polarity. The grayscale voltages with positive polarity are situated between the power supply potential VDD and a common voltage intermediate between VDD and the ground potential (GND); the grayscale voltages with negative polarity are situated the common voltage and GND. The grayscale voltages VH0 to VH255 shown in the first embodiment and the following embodiments represent only the positive polarity. The first selection circuit 100 and second selection circuit 110 both select grayscale voltages of the positive polarity. It will be appreciated that a generally similar circuit can be used to provide the grayscale voltages of negative polarity.

The decoder circuit shown in the first embodiment is formed in a p-type semiconductor substrate 120. The PMOS transistors constituting the first selection circuit 100 are formed in an n-well 90 disposed in the p-type semiconductor substrate 120. The NMOS transistors constituting the second selection circuit 110 may be formed directly in the p-type semiconductor substrate 120, as shown in FIG. 13, or may be formed in a p-well disposed within the n-well 90.

As described above, according to the first embodiment, the addition of a second selection circuit 110 comprising NMOS transistors to the conventional PMOS selection circuit 100 compensates for the reduction in PMOS drain current IDS that occurs when a low analog grayscale voltage such as VH0 is selected, so that even in this case, the output node OUT reaches the selected analog grayscale voltage level within the allowable time TMAX.

Second Embodiment

Figure 17:
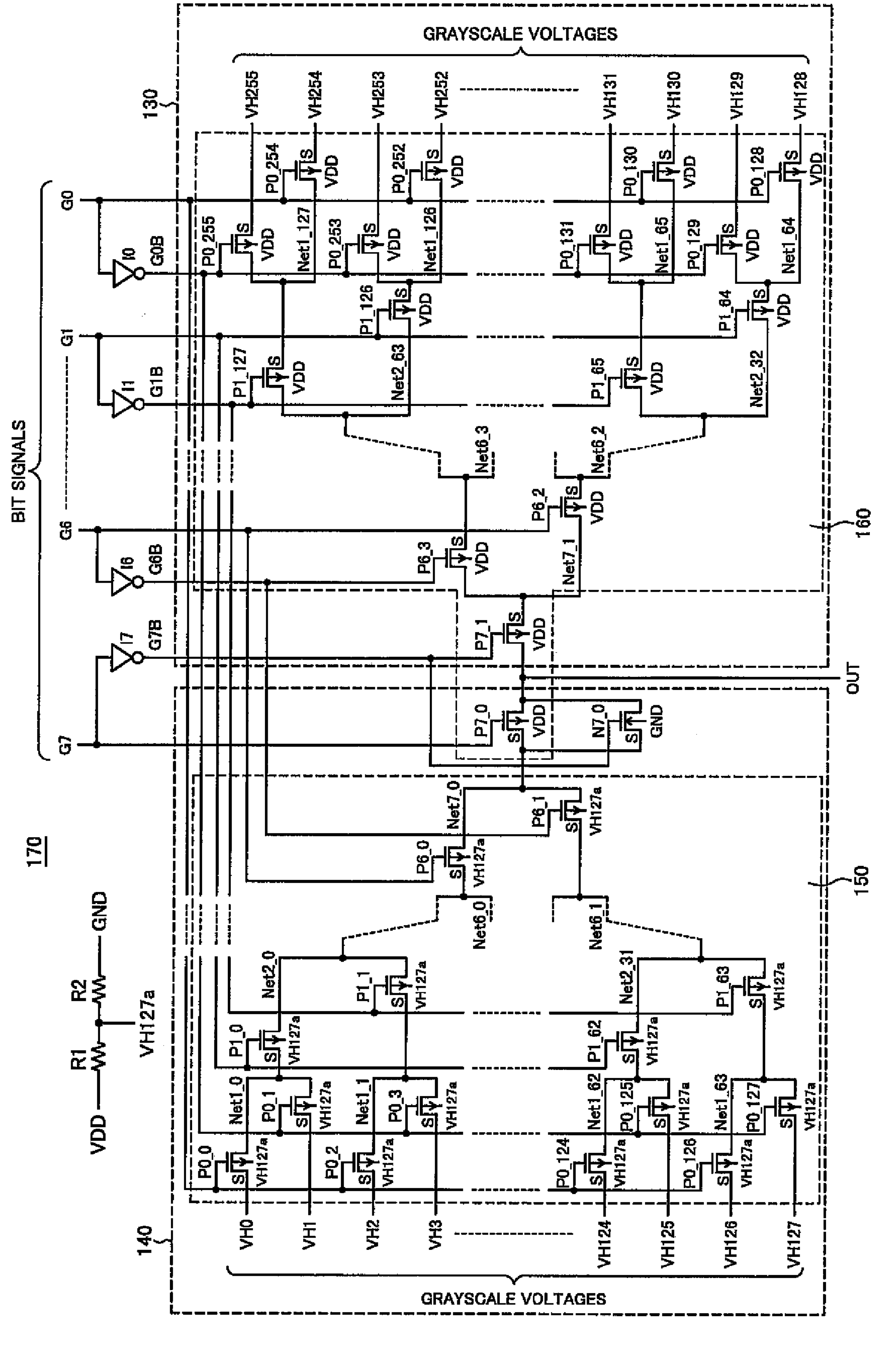
FIG. 17 is a circuit diagram of an eight-bit decoder circuit according to a second embodiment of the invention.

Referring to FIG. 17, the second embodiment adds an NMOS transistor N7_0 and resistors R1, R2 to the conventional decoder circuit shown in FIG. 2. The NMOS transistor N7_0 has a source electrode connected to node Net7_0, a gate electrode connected to node G7B, and a drain electrode connected to the output node OUT. One terminal of resistor R1 is connected to a VDD node. The other terminal of resistor R1 and one terminal of resistor R2 are connected to a node VH127*a*. The other terminal of resistor R2 is connected to a ground node (GND). The resistance ratio of resistors R1 and R2 is selected so that the voltage at node VH127*a* is equal to the voltage at node VH127.

The PMOS transistors in the second embodiment are divided into a first selection circuit 130 that selects analog grayscale voltages VH128 to VH255 (the first group) and a second selection circuit 140 that selects analog grayscale voltages VH0 to VH127 (the second group).

Transistors P0_0 to P0_127, P1_0 to P1_63, P2_0 to P2_31, P3_0 to P3_15, P4_0 to P4_7, P5_0 to P5_3, P6_0, and P6_1, which constitute the greater part of the second selection circuit 140, are formed in a second n-well 150 that is isolated from the first n-well 160 in which the other PMOS transistors are formed. The second n-well 150 is connected to node VH127*a*; the first n-well 160 is connected to a VDD node. Both n-wells 150, 160 are disposed in a p-type semiconductor substrate 170, in which the resistors R1, R2 and NMOS transistor N7_0 are formed. The p-type semiconductor substrate 170 is grounded.

All of the PMOS transistors in the first selection circuit 130 are formed in the first substrate or n-well 160, which is biased at the VDD level. The second selection circuit 140 comprises the PMOS transistors formed in the second substrate or n-well 150, which is biased at the VH127*a* level, one PMOS transistor P7_0 formed in the first n-well 160, which is biased at the VDD level, and the NMOS transistor N7_0, which is formed in the p-type substrate 170 biased at ground level (GND). PMOS transistor P7_0 and NMOS transistor N7_0 are connected in parallel and are switched on and off together by the most significant input bit and its inverted bit (G7 and G7B).

As a point of terminology, in order to have all of the transistors in the second selection circuit disposed in the same n-well 150, transistors P7_0 and N7_0 can be considered external to the second selection circuit. Similarly, transistor P7_1 can be considered external to the first selection circuit. If this terminology is used, node Net7_1 becomes the root node of the first selection circuit, and node Net7_0 becomes the root node of the second selection circuit.

As shown in FIG. 4, when the input signals G0 to G7 represent an input code in the range from 80h to FFh (selecting an analog grayscale voltage in the first group from VH128 to VH255), node G7 is at the '1' logic level and node G7B is at the '0' logic level. Therefore, transistors P7_0 and N7_0 are both turned off, blocking voltage levels VH0 to VH127 from reaching the output node OUT, resulting in the same circuit operation as in the conventional circuit in FIG. 2. When the input signals G0 to G7 represent an input code in the range from 00h to 7Fh (selecting an analog grayscale voltage in the second group from VH0 to VH127), the circuit operation is also basically the same as in FIG. 2, except that the substrate (n-well 150) of PMOS transistors P0_0 to P0_127, P1_0 to P1_63, P2_0 to P2_31, P3_0 to P3_15, P4_0 to P4_7, P5_0 to P5_3, P6_0 and P6_1 is biased at the VH127*a* level instead of the VDD level. This reduced substrate bias alters the drain current IDS. The drain currents IDS in the two extreme cases, when analog grayscale voltage VH127 is selected and when analog grayscale voltage VH0 is selected, will be described below.

If the gate-source voltages VGS of transistors P0_127 and P0_0 are denoted VGS_127 and VGS_0, respectively, and the substrate-source voltages VBS of transistors P0_127 and P0_0 are denoted VBS_127 and VBS_0, respectively, these voltages are given as follows:

$$VGS\_127=0(\text{ground level})-VH127=-VH127$$

$$VBS\_127=VH127a-VH127$$

$$VGS\_0=0(\text{ground level})-VH0=-VH0$$

$$VBS\_0=VH127a-VH0$$

Since the potential level at the node VH127*a* connected to the second n-well 150 is set by resistors R1 and R2 so as to be equal to analog grayscale voltage VH127, the relation VH127*a*=VH127 is satisfied.

Figure 6:
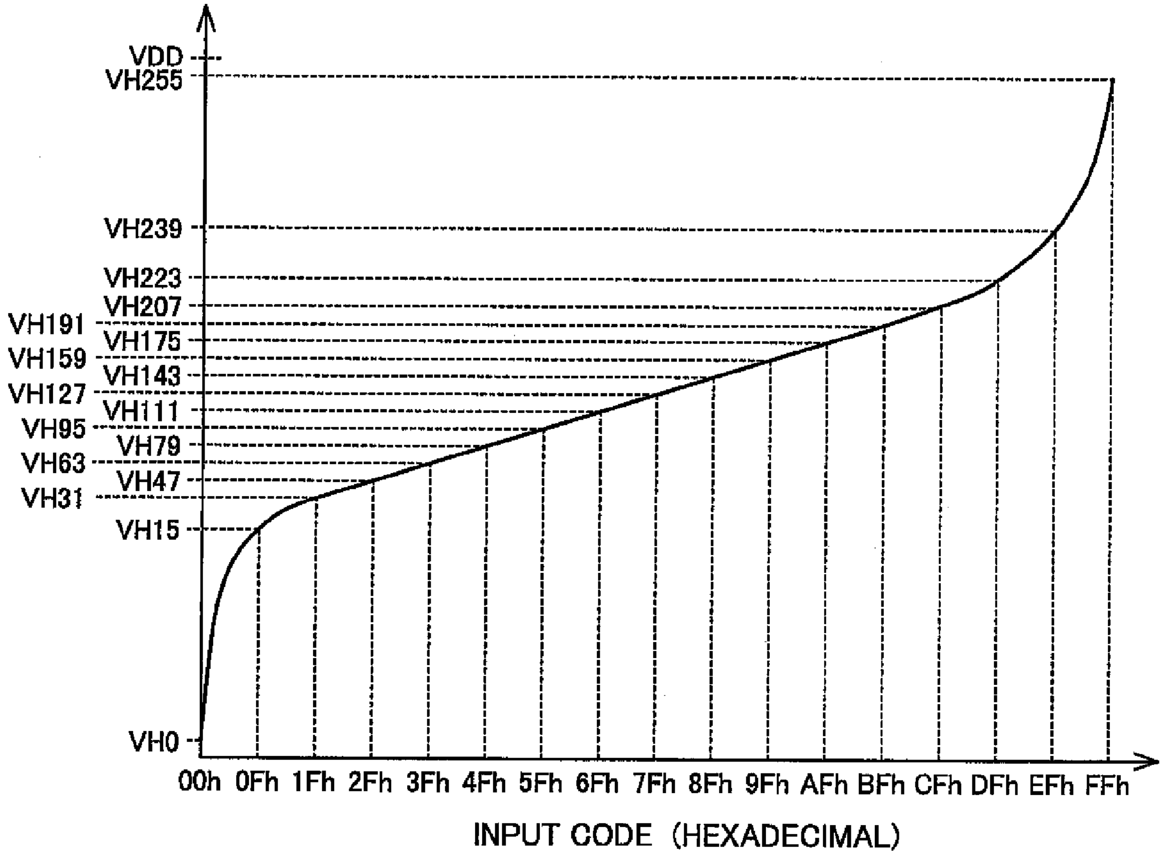
FIG.6 PRIOR ART
FIG. 6 is a graph illustrating grayscale voltages and their input codes.
Figure 7:
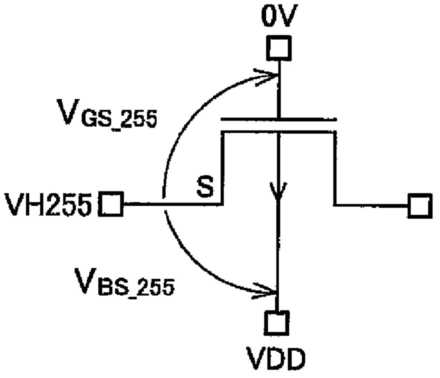
FIG.7 PRIOR ART
FIGS. 7 and 8 illustrate transistor voltages.
Figure 8:
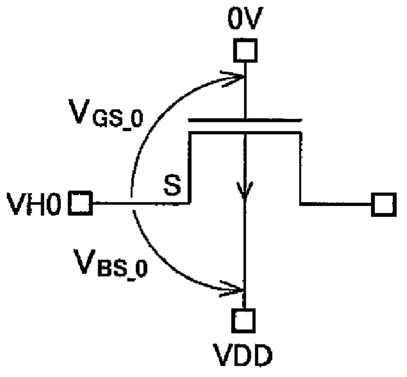
FIG.8 PRIOR ART
Figure 9:
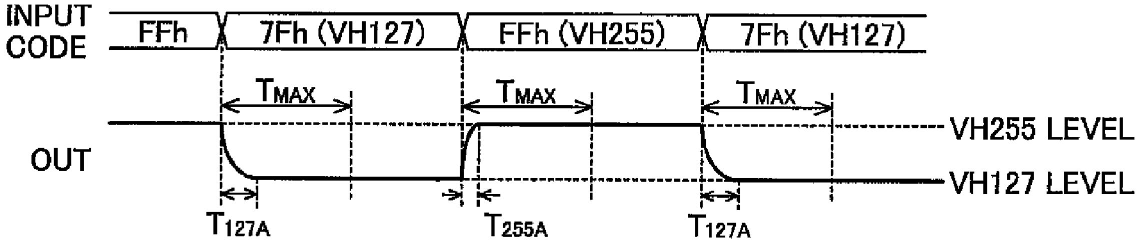
FIG.9 PRIOR ART
FIGS. 9, 10, 11, and 12 illustrate alternate input of two digital signals and the resulting analog output voltage waveforms in the prior art.
Figure 10:
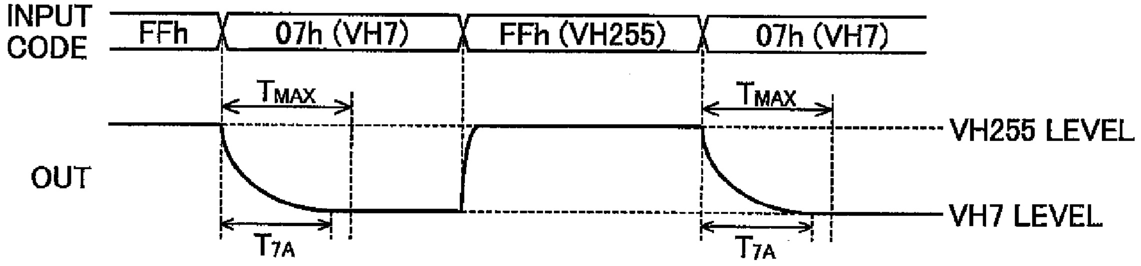
FIG.10 PRIOR ART
Figure 11:
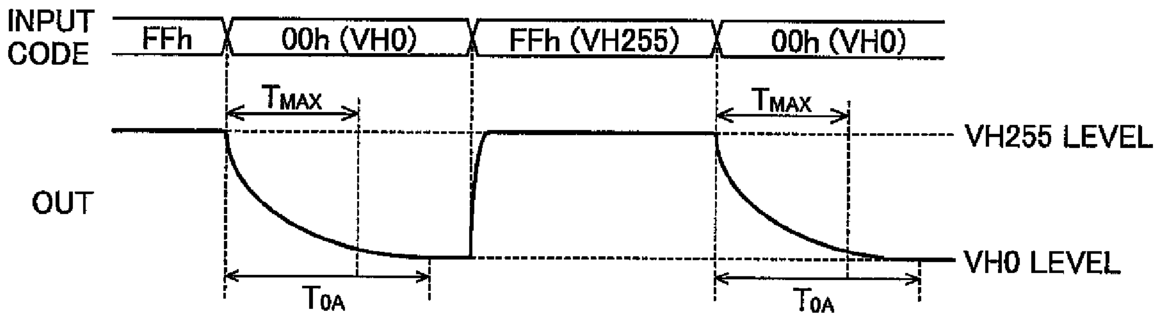
FIG.11 PRIOR ART
Figure 12:
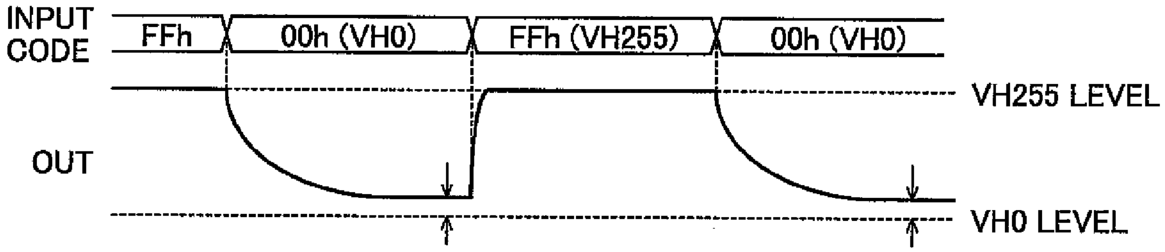
FIG.12 PRIOR ART

In addition, from the analog grayscale voltage curve in FIG. 6, voltage VH127 can be assumed to have the following value:

$$VH127=3/4\cdot VDD$$

Substituting these relations into the above equations yields:

$$VGS\_127=-VH127=-(3/4)\cdot VDD$$

$$VBS\_127=VH127a-VH127=0$$

$$VGS\_0=-VH0=-(1/2)\cdot VDD$$

$$VBS\_0=VH127a-VH0=(1/4)\cdot VDD$$

In the conventional circuit operation, the corresponding voltages VGS, VBS are given as follows.

$$VGS\_127=-(3/4)\cdot VDD$$

$$VBS\_127=(1/4)\cdot VDD$$

$$VGS\_0=-(1/2)\cdot VDD$$

$$VBS\_0=(1/2)\cdot VDD$$

Figure 5:
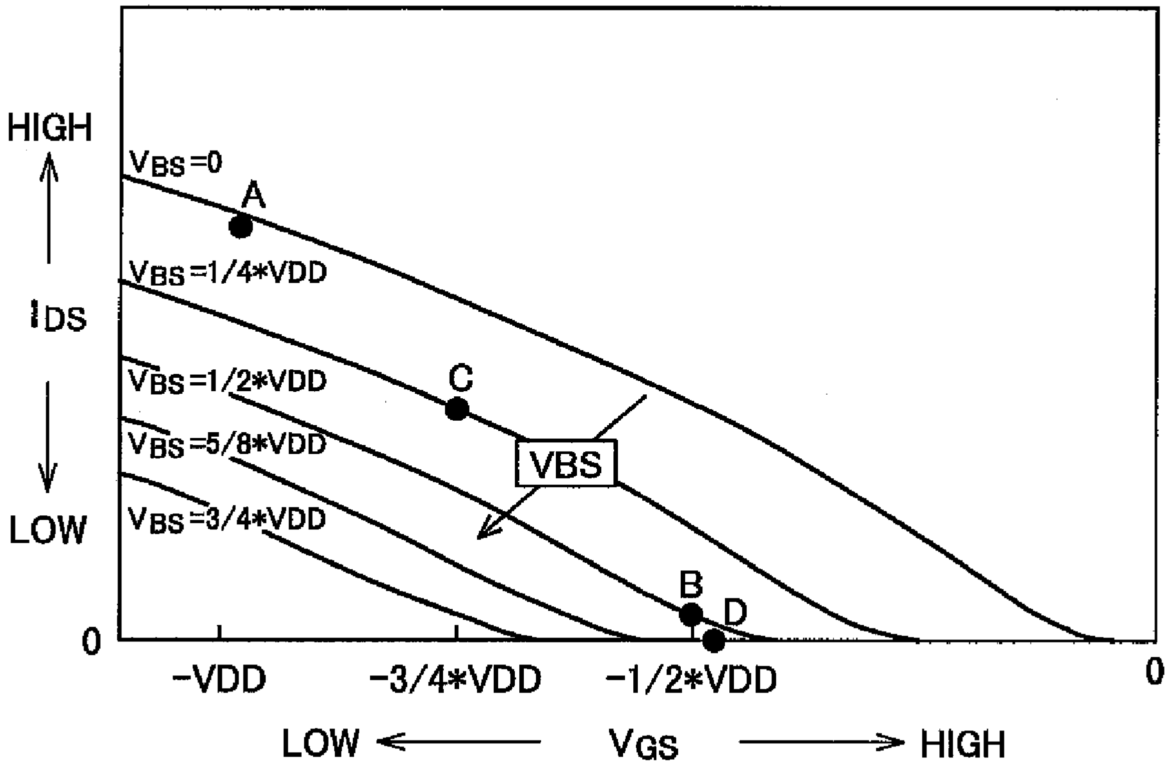
FIG.5 PRIOR ART
FIG. 5 is a graph illustrating current characteristics of the transistors in FIGS. 1 and 2.
Figure 18:
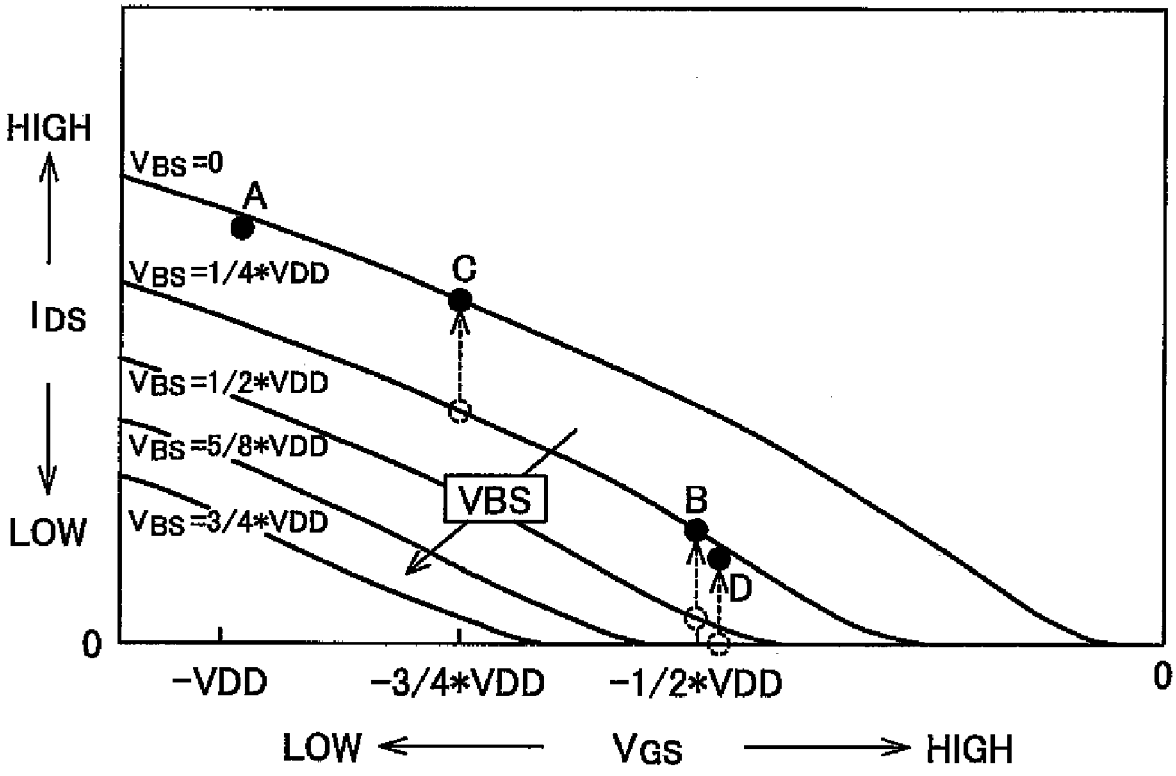
FIG. 18 is a graph illustrating current characteristics of the transistors the second n-well in FIG. 17.

A comparison of these voltages shows that connecting node VH127*a*, which has a potential level equal to analog grayscale voltage VH127, to the second n-well 150 reduces the VBS voltage of the PMOS transistors in the second selection circuit 140 without changing their VGS voltages. The operating points of the PMOS transistors in the second selection circuit 140 produced by the reduced VBS voltage are shown in FIG. 18. Point A, the operating point when voltage VH255 is selected, is the same as in FIG. 5, producing the conventional drain current IDS, but the operating point B when voltage VH0 is selected, the operating point C when voltage VH127 is selected, and the operating point D when voltage level VH0 is selected all change from the conventional position, represented by a dotted circle, to a higher position with greater drain current IDS, due to reduced substrate-source voltage VBS.

The operating points in FIG. 18 do not apply to PMOS transistor P7_0, but NMOS transistor N7_0 compensates for the reduced drain current IDS of PMOS transistor P7_0 at low selected grayscale voltage levels. The reason why the substrate of transistor P7_0 is not connected to node VH127*a* is that when one of the analog grayscale voltages in the first group from VH128 to VH255 is selected, transistor P7_0 receives the selected voltage at its drain electrode from the first selection circuit 130. If the substrate of transistor P7_0 were biased at the VH127*a* level instead of the VDD level, the p-type drain of transistor P7_0 would be at a higher potential than its n-type substrate and current would flow into the substrate, adversely affecting the response at the output node OUT and also perturbing the potential of node VH127*a*. For these reasons, transistor P7_0 is placed in the substrate 160 connected to VDD as in the prior art.

Since the substrate 160 of transistor P7_0 is biased at the VDD level, its drain current IDS is when low analog grayscale voltages are selected, as in the conventional decoder circuit. NMOS transistor N7_0 is therefore added to compensate, essentially as in the first embodiment.

As described above, according to the second embodiment, the substrate (n-well 150) of PMOS transistors P0_0 to P0_127, P1_0 to P1_63, P2_0 to P2_31, P3_0 to P3_15, P4_0 to P4_7, P5_0 to P5_3, P6_0 and P6_1 is connected to node VH127*a* instead of node VDD. Resistors R1 and R2 set the potential of node VH127*a* to a level equal to the potential level of node VH127. NMOS transistor N7_0 compensates for the reduced drain current IDS of transistor P7_0. Increased output currents are therefore provided for all the grayscale voltages in the second group from VH0 to VH127, reducing the time needed for these voltages to be reached at the output node OUT.

An advantage of the second embodiment is that if the grayscale voltages are changed by changing the curve in FIG. 6, it is not necessary to design new fabrication masks to change the transistor configuration of the decoder circuit. It suffices to change just two mask layers to modify the voltage division ratio of resistors R1 and R2. The second embodiment thus provides enhanced versatility at a low cost. Moreover, in a source driver chip with multiple decoder circuits (hundreds or thousands of decoder circuits, for example), it is not necessary provide a separate pair of resistors R1, R2 for each decoder circuit; one pair of resistors suffices for the entire chip, or one pair of resistors may be provided per block of several tens or hundreds of decoder circuits. Compared with the first embodiment, accordingly, the second embodiment requires fewer additional circuit elements, resulting in a smaller chip size and hence a lower cost per chip.

In the above description of the second embodiment, the division between the first and second groups of grayscale voltages is made at the midpoint of the grayscale. The second embodiment can be modified, however, by dividing the grayscale at an arbitrary point to suit application requirements. The second embodiment may also be used in combination with the first embodiment. In another variation of the second embodiment, the resistance ratio of resistors R1 and R2 is selected to produce, instead of the voltage (VH127) at the top of the second group of analog grayscale voltages, another voltage close to this voltage. The bias voltage of the second n-well 150 can be raised or lowered by a number of grayscale levels equal to about five percent of the total number of levels in the grayscale without greatly changing the effect of the second embodiment.

Third Embodiment

Figure 19:
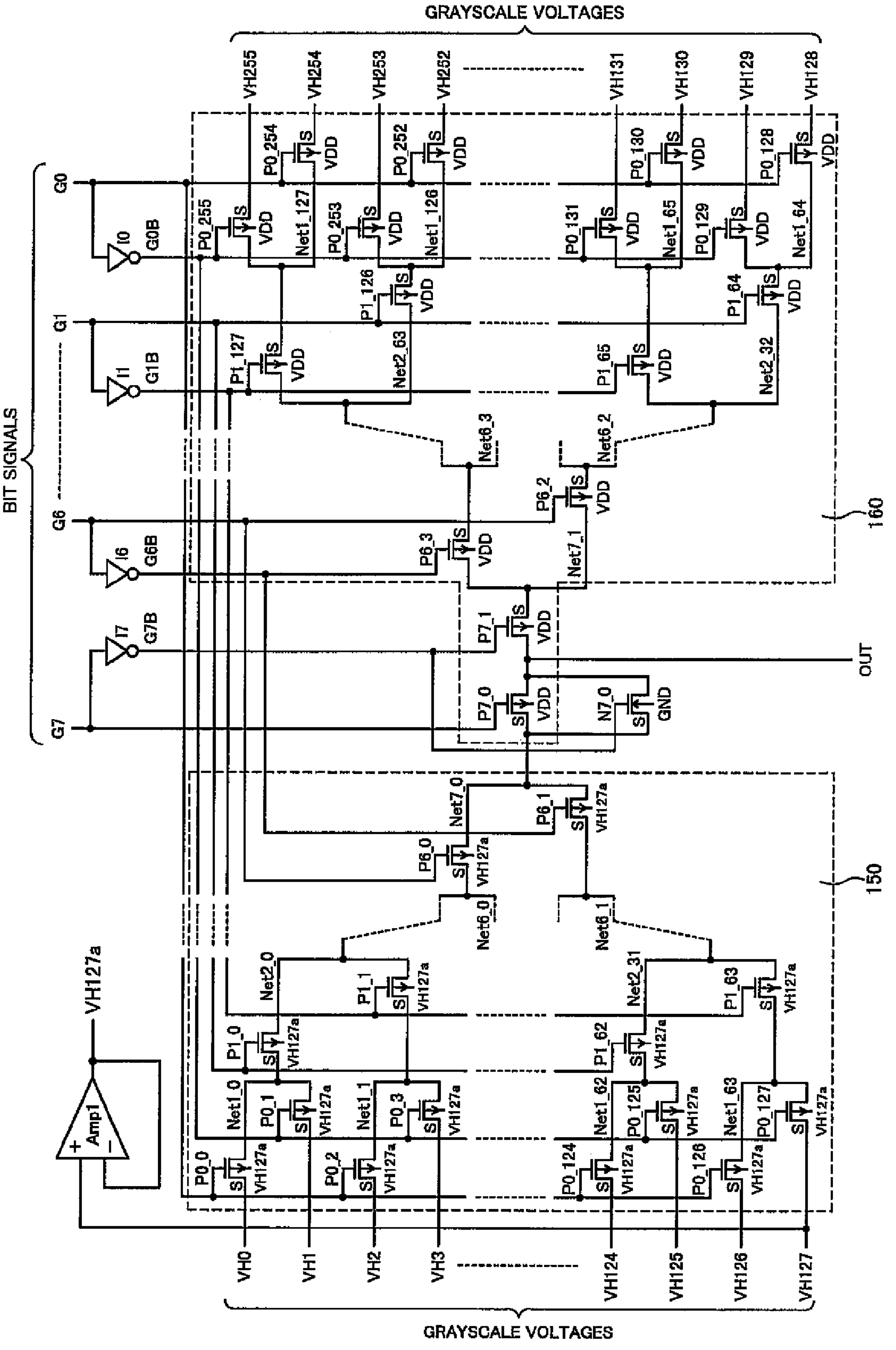
FIG. 19 is a circuit diagram of an eight-bit decoder circuit according to a third embodiment of the invention.

Referring to FIG. 19, the third embodiment has an operational amplifier circuit Amp1 in place of the resistors R1, R2 in the second embodiment. The amplifier circuit Amp1 has an output terminal connected to node VH127*a*, a non-inverting input terminal connected to node VH127, and an inverting input terminal connected to node VH127*a*. Since the terminals of the amplifier circuit Amp1 are connected as above, the amplifier circuit Amp1 functions as a voltage follower with unity voltage gain, outputting a voltage equal to analog grayscale voltage VH127 to the second n-well 150.

One effect of the third embodiment is to completely eliminate the need for any alteration of the decoder circuit when the input analog grayscale voltages are changed. Another effect is to reduce the time required for the second n-well 150 to reach the desired bias voltage level, since the amplifier circuit has a lower impedance than the resistors of the second embodiment. The influence of power-supply and ground noise on the bias voltage is also reduced.

Fourth Embodiment

Figure 20:
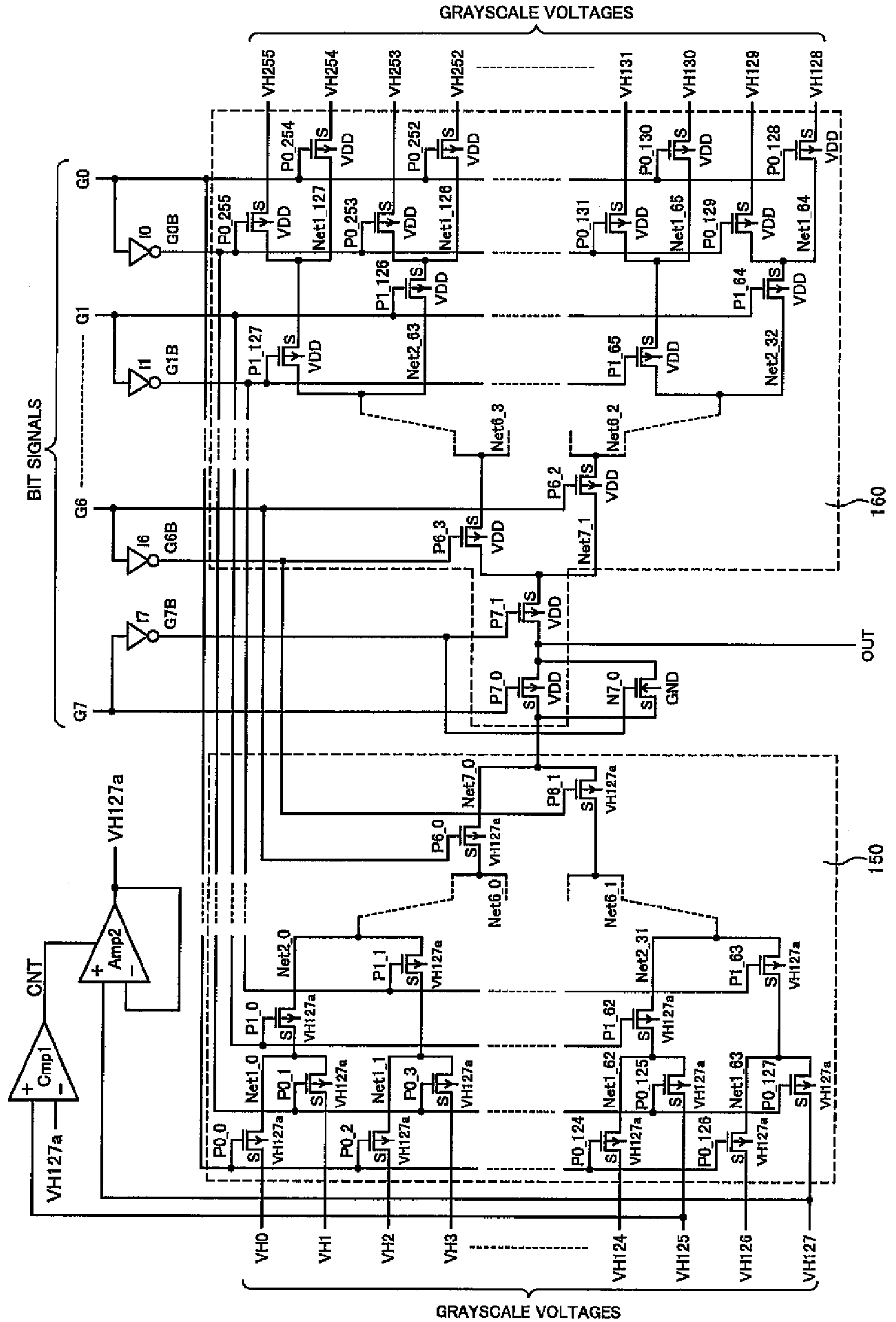
FIG. 20 is a circuit diagram of an eight-bit decoder circuit according to a fourth embodiment.
Figure 21:
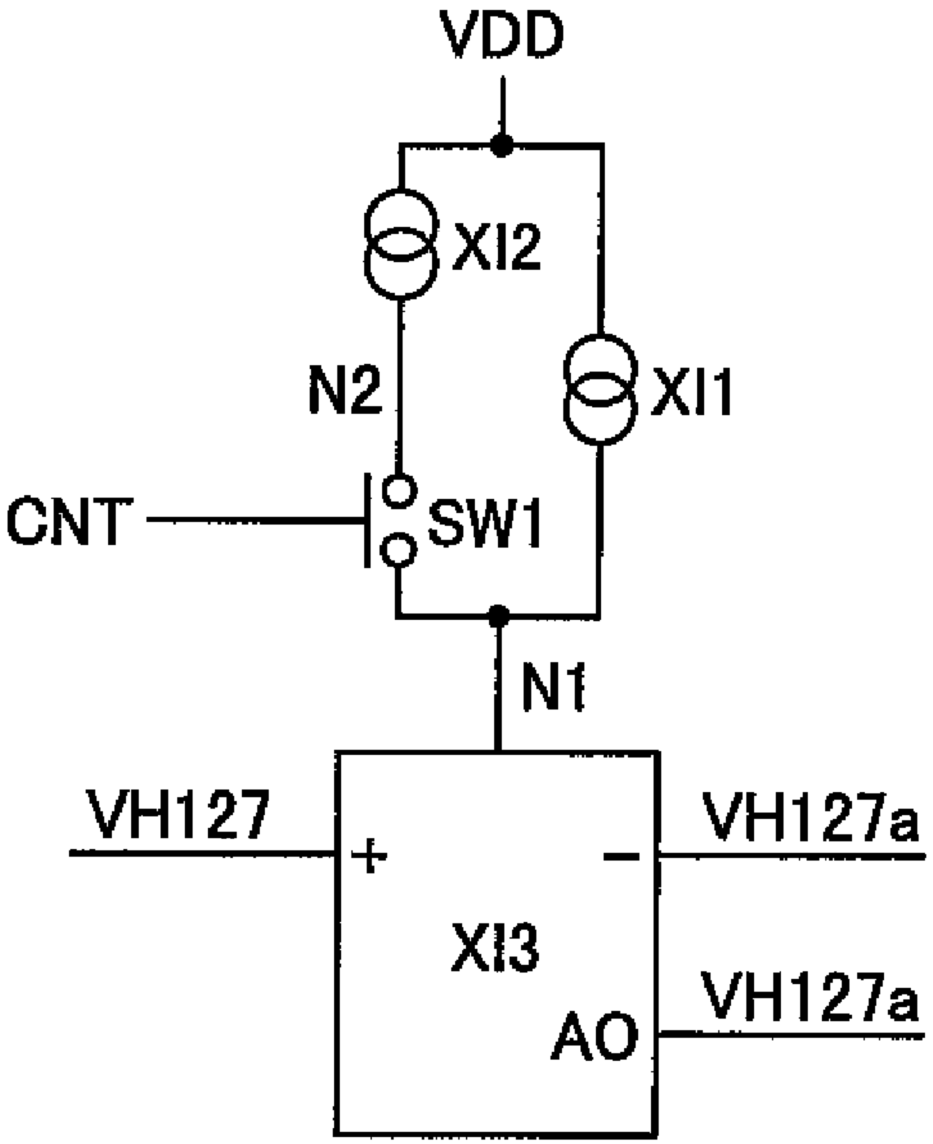
FIG. 21 is a circuit diagram of the voltage follower amplifier in the fourth embodiment.

Referring to FIG. 20, the fourth embodiment replaces the amplifier circuit Amp1 in the third embodiment with an amplifier circuit Amp2 having a current control function and a comparator Cmp1. The comparator Cmp1 has a non-inverting input terminal connected to node VH125, an inverting input terminal connected to node VH127*a*, and an output terminal connected to a control node CNT. Referring to FIG. 21, the amplifier circuit Amp2 has an internal structure comprising two current sources XI1, XI2, a switch SW1, and an amplifier circuit XI3 lacking a current source. Current source XI1 has one terminal connected to node VDD and another terminal connected to a node N1. Current source XI2 has one terminal connected to node VDD and another terminal connected to a node N2. Switch SW1 has a control terminal connected to node CNT and two other terminals, one of which is connected to node N2 and the other of which is connected to node N1. The amplifier circuit XI3 has a current input terminal connected to node N1, a non-inverting input terminal connected to node VH127, an inverting input terminal connected to node VH127*a*, and an output terminal AO connected to node VH127*a*, and operates as a voltage follower.

Since the terminals of the comparator Cmp1 are connected as above, node CNT goes to the low level when the voltage at node VH127*a* (n-well 150) is lower than the voltage at node VH125 and goes to the high level when the voltage at node VH127*a* is higher than the voltage at node VH125. Switch SW1 is in the conducting state when node CNT is at the low level and is in the open state when node CNT is at the high level. The current output of current source XI1 is smaller than the current output of current source XI2, and their sum equals the operating current of the amplifier circuit Amp1 in the third embodiment.

The operation of the fourth embodiment when power is turned on and the voltage level at node VH127*a* (n-well 150) rises from the ground level to the VH127 voltage level will now be described. When the voltage level at node VH127*a* is lower than the voltage level at node VH125, node CNT goes low, which brings switch SW1 into the conducting state. Nodes N1 and N2 are therefore interconnected, so the amplifier circuit XI3 operates with the sum of the two currents output by current sources XI1 and XI2. When the voltage at node VH127*a* reaches a level higher than the voltage at node VH125, node CNT goes high, which brings switch SW1 into the open state. The amplifier circuit XI3 then operates with only the current of current source XI1, and continues to operate at this reduced current level as node VH127*a* reaches and remains at the VH127 voltage level.

The non-inverting input terminal of the comparator Cmp1 is connected to a node (VH125) having a lower voltage level than node VH127 to allow for offsets occurring in the amplifier circuit Amp2 and comparator Cmp1. Although the non-inverting input terminal of the comparator Cmp1 may be connected to any node having a lower voltage level than node VH127, a node having a voltage level as close to the voltage level at node VH127 as possible is preferable.

In the fourth embodiment, the comparator Cmp1 controls the current supplied to the amplifier circuit Amp2 so as to provide ample current to bring the second n-well 150 to the desired potential (VH127) quickly, and then reduces the current supply once the voltage level at node VH127*a* has reached substantially the VH127 level, thereby reducing the current consumption of the amplifier circuit Amp2.

Fifth Embodiment

Figure 22:
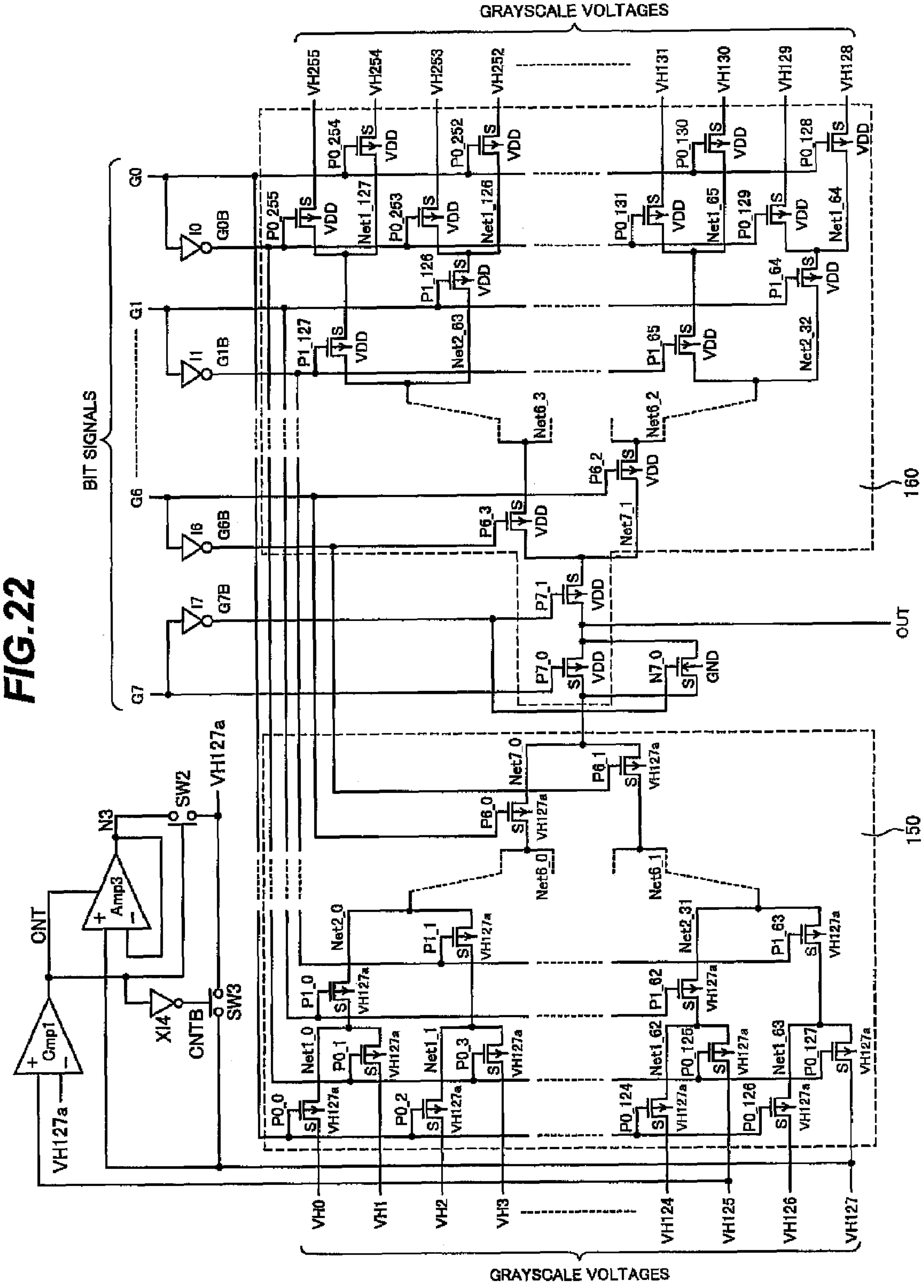
FIG. 22 is a circuit diagram of an eight-bit decoder circuit according to a fifth embodiment.
Figure 23:
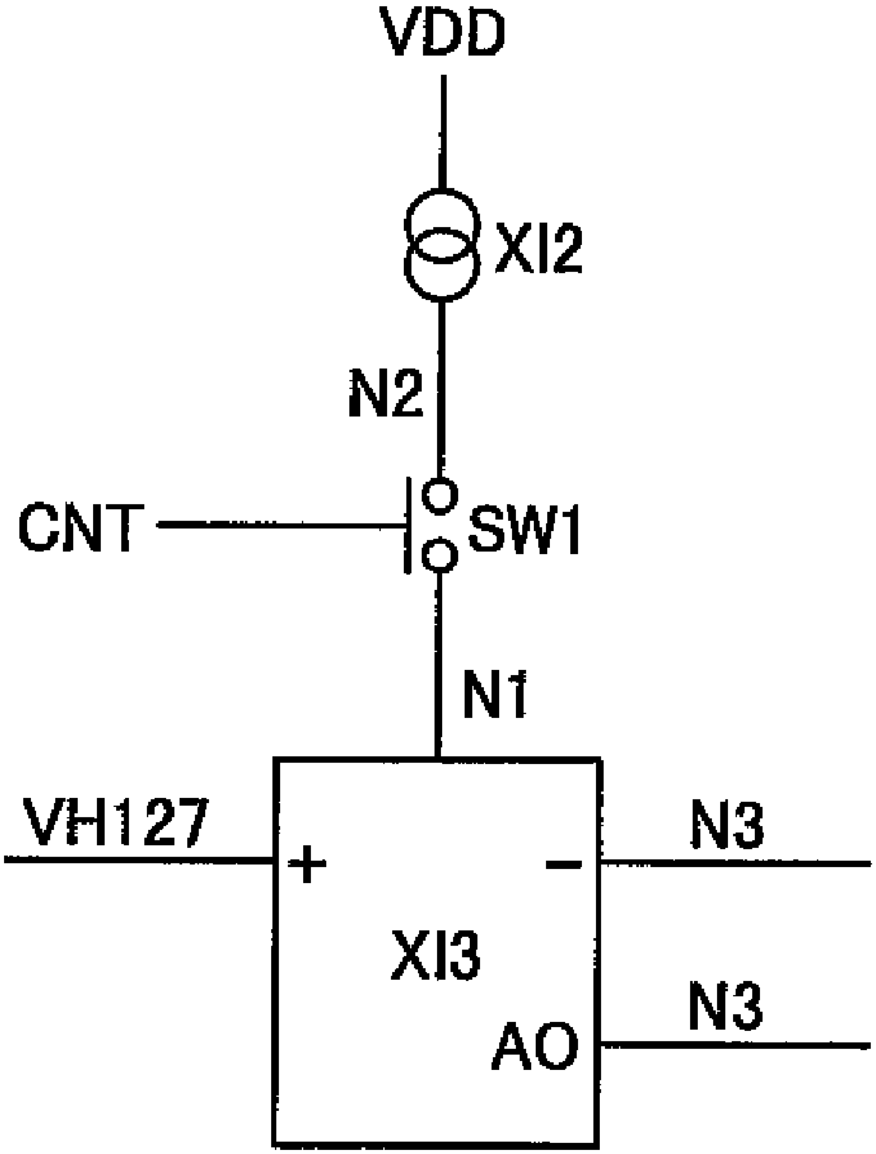
FIG. 23 is a circuit diagram of the voltage follower amplifier in the fifth embodiment.

Referring to FIG. 22, the fifth embodiment replaces the amplifier circuit Amp2 in the fourth embodiment with a modified amplifier circuit Amp3, a pair of switches SW2, SW3, and an inverter XI4. Referring to FIG. 23, amplifier circuit Amp3 has the same internal structure as in the fourth embodiment (FIG. 21) except that there is only one current source XI2, so when switch SW1 is in the off state, all current flow through the amplifier element XI3 ceases.

The amplifier circuit Amp3 has a non-inverting input terminal connected to node VH127, an inverting input terminal connected to a node N3, and an output terminal connected to node N3. Inverter XI4 has an input terminal connected to the control node CNT from which the switch SW1 in the amplifier circuit Amp3 is controlled, and an output terminal connected to another control node CNTB. Switch SW2 has a control terminal connected to control node CNT and two other terminals, one of which is connected to node N3 and the other of which is connected to node VH127*a*. Switch SW3 has a control terminal connected to control node CNTB and two other terminals, one of which is connected to node VH127 and the other of which is connected to node VH127*a*.

As in the fourth embodiment, control node CNT goes to the low level when the voltage at node VH127*a* (n-well 150) is lower than the voltage at node VH125 and goes to the high level when the voltage at node VH127*a* is higher than the voltage at node VH125. Like switch SW1 in the amplifier circuit Amp3, switches SW2 and SW3 are in the conducting state when their control nodes CNT and CNTB are at the low level and are in the open state when CNT and CNTB are at the high level. When the voltage level at node VH127*a* is lower than the voltage level at node VH125, node CNT goes to the low level, which is inverted to the high level by inverter XI4 and supplied to node CNTB. Since node CNT is at the low level, switch SW1 interconnects nodes N1 and N2, so that the amplifier circuit XI3 operates with current supplied by the current source XI2. Since node CNT is at the low level, switch SW2 interconnects nodes N3 and VH127*a*. Since node CNTB is at the high level, switch SW3 disconnects nodes VH127 and VH127*a*. The voltage supply to node VH127*a* (the biasing of n-well 150) is therefore performed through the amplifier circuit Amp3.

When the voltage level at node VH127*a* is higher than the voltage level at node VH125, node CNT goes to the high level and node CNTB goes to the low level. Nodes N1 and N2 are therefore disconnected by switch SW1 and the amplifier circuit Amp3 consumes no current. Switch SW2 disconnects nodes N3 and VH127*a*, and switch SW3 interconnects nodes VH127, VH127*a*, so node VH127*a* (n-well 150) receives its bias voltage directly from node VH127.

The non-inverting input terminal of the comparator Cmp1 is connected to a node (VH125) having a lower voltage level than the voltage level at node VH127 to allow for offsets occurring in the amplifier circuit Amp3 and comparator Cmp1. Although the non-inverting input terminal of the comparator Cmp1 may be connected to any node having a lower voltage level than node VH127, a node having a voltage level as close to the voltage level at node VH127 as possible is preferable.

In the fifth embodiment, as in the fourth embodiment, the voltage supply path to node VH127*a* (n-well 150) is controlled by the output state of the comparator Cmp1. When the voltage level at node VH127*a* is rising but is still not close to the voltage level at node VH127 (has not yet reached the voltage level at node VH125), the amplifier circuit Amp3 is activated to supply a voltage equal to the VH127 level to node VH127*a* (n-well 150). Once the voltage level at node VH127*a* reaches the voltage level at node VH125, the amplifier circuit Amp3 is inactivated so that it ceases to draw current, and the voltage supplied to node VH127*a* is taken directly from node VH127.

The effect of the fifth embodiment is that as soon as the voltage level at node VH127*a* (n-well 150) is sufficiently close to the desired VH127 level, current consumption in the amplifier circuit Amp3 is reduced to zero.

Sixth Embodiment

Figure 24:
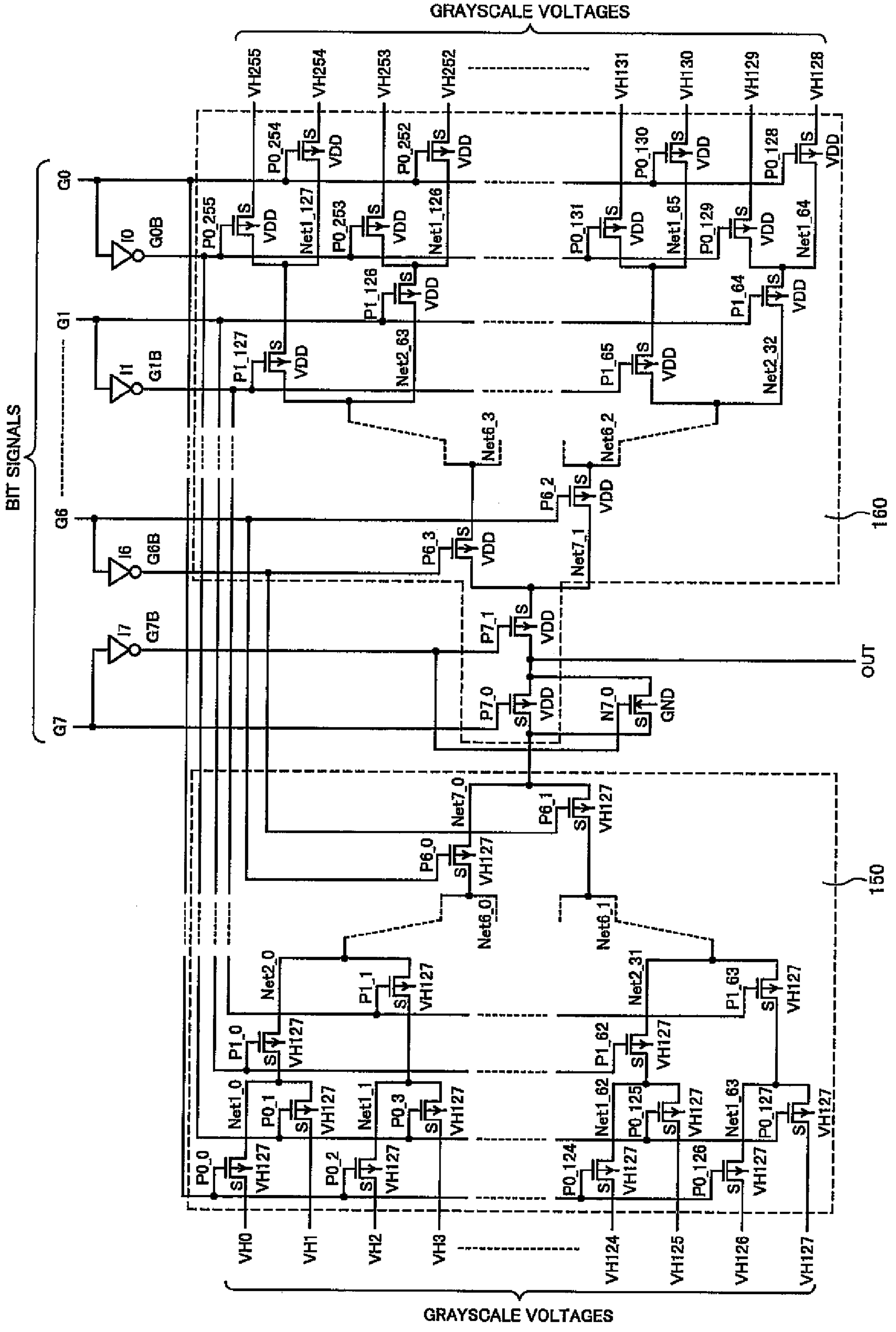
FIG. 24 is a circuit diagram of an eight-bit decoder circuit according to a sixth embodiment.

Referring to FIG. 24, the sixth embodiment removes the comparator Cmp1, amplifier circuit Amp3, inverter XI4, switches SW2, SW3, and node VH127*a* of the fifth embodiment and simply connects the n-well 150 to node VH127. The substrate of transistors P0_0 to P0_127, P1_0 to P1_63, P2_0 to P2_31, P3_0 to P3_15, P4_0 to P4_7, P5_0 to P5_3, P6_0 and P6_1 is therefore biased directly from node VH127. Although it takes longer for the substrate potential of these transistors to reach the VH127 level at power-up than in the third, fourth, and fifth embodiments, the additional biasing circuit elements required in those embodiments are eliminated, further reducing the size and cost of a chip in which the decoder circuit is used.

Seventh Embodiment

Figure 25:
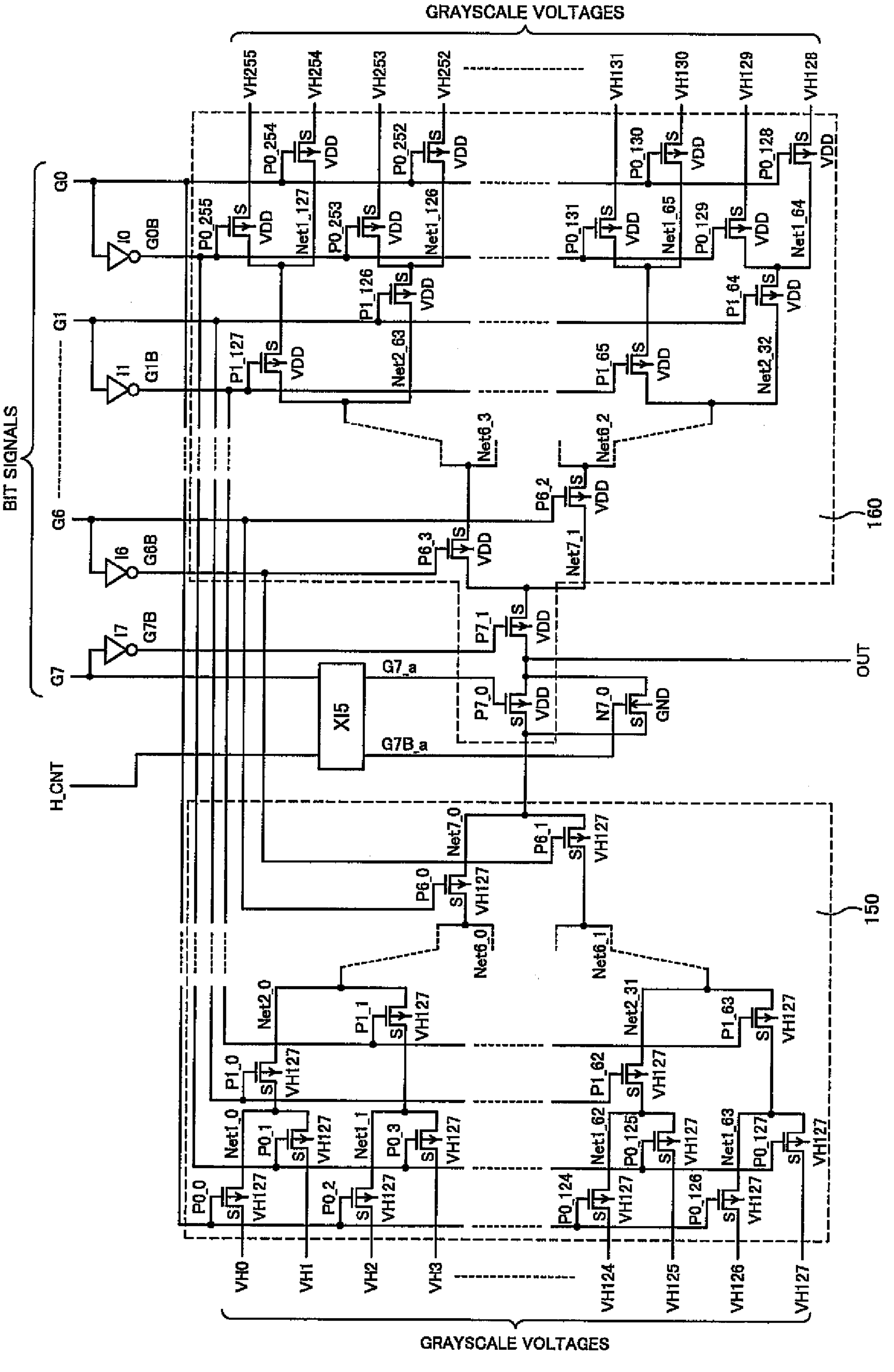
FIG. 25 is a circuit diagram of an eight-bit decoder circuit according to a seventh embodiment.

Referring to FIG. 25, the seventh embodiment adds a timing circuit XI5 to the configuration in FIG. 24. The input nodes of the timing circuit XI5 are node G7 and an external control node H_CNT. The output nodes G7_*a* and G7B_*a* of the timing circuit XI5 output gated versions of bit signals G7 and G7B.

Figure 26:
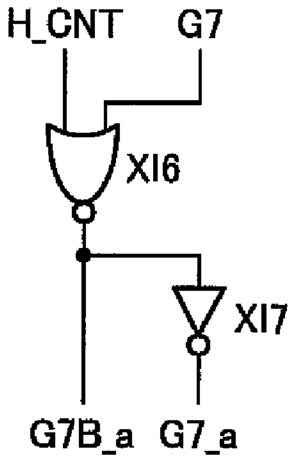
FIG. 26 is a circuit diagram of the timing circuit in the seventh embodiment.

Referring to FIG. 26, the timing circuit XI5 is a logic circuit comprising a NOR gate XI6 and an inverter XI7. The NOR gate XI6 has two input terminals, one of which is connected to node G7 and the other of which is connected to node H_CNT, and an output terminal connected to node G7B_*a*. The inverter XI7 has an input terminal connected to node G7B_*a* and an output terminal connected to node G7_*a*. The gate electrodes of PMOS transistor P7_0 and NMOS transistor N7_0 are connected to nodes G7_*a* and G7B_*a*, respectively.

The signal at node H_CNT is normally low, but is driven high for short periods of time during which the logic levels of nodes G1 to G7 change. When H_CNT is low, the logic levels at nodes G7_*a* and G7B_*a* are identical to the logic levels at nodes G7 and G7B, respectively. When H_CNT is high, node G7_*a* is high and node G7B_*a* is low, regardless of the levels of nodes G7 and G7B.

Figure 27:
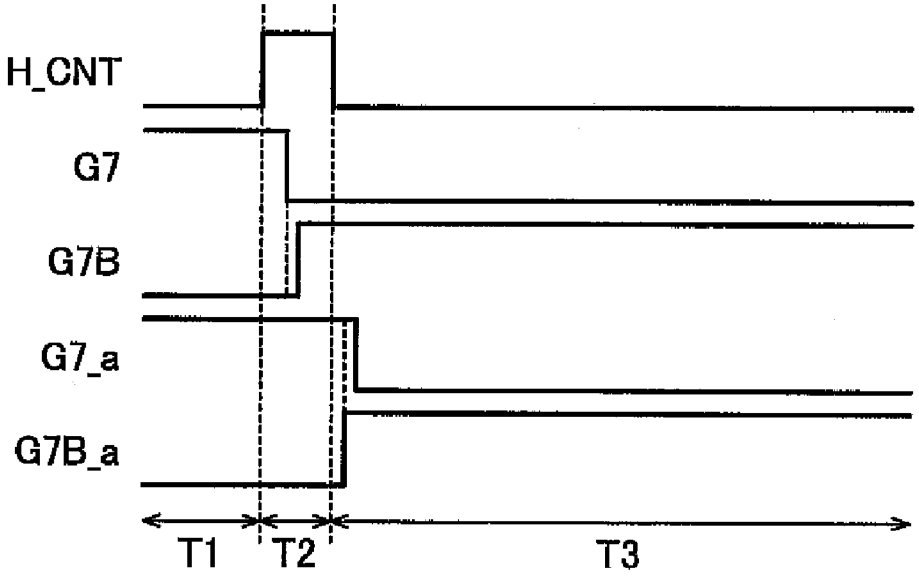
FIG. 27 is a timing waveform diagram illustrating the operation of the seventh embodiment.

FIG. 27 illustrates the operation of the timing circuit XI5 around a high-to-low transition of the bit signal at node G7.

During the initial time period T1, node H_CNT is low, node G7 is high, node G7B is low, node G7_*a* is high, and node G7B_*a* is low. Therefore, in FIG. 25, PMOS transistor P7_0 is in the off state, NMOS transistor N7_0 is in the off state, PMOS transistor P7_1 is in the on state, and one of the first group of analog grayscale voltages VH128 to VH255 is output to the output node OUT.

During time period T2, first node H_CNT goes high, then node G7 goes low, and then node G7B goes high slightly later, because of a propagation delay in inverter I7. Since node H_CNT is high, nodes G7_*a* and G7B_*a* remain at the high and low levels, respectively, so transistors P7_0 and N7_0 remain in the off state. Once node G7B goes high, transistor P7_1 also turns off, leaving the output node OUT in the high-impedance state.

During time period T3, first node H_CNT goes low, allowing node G7B_*a* to go high to match the level at node G7B. After a brief propagation delay in inverter XI7, node G7_*a* goes low to match the level at node G7. PMOS transistor P7_1 is now in the off state while PMOS transistor P7_0 and NMOS transistor N7_0 are in the on state, so one of the second group of analog grayscale voltages VH0 to VH127 is output at the output node OUT.

Whenever the state of node G7 changes from high to low or vice versa, the state of node G7B changes after a delay caused by the transistor switching time or response time and the parasitic capacitance and resistance of the signal wiring. Consequently, a state may briefly occur in which nodes G7 and G7B are both at the low logic level, as illustrated in FIG. 27. In the second to sixth embodiments, PMOS transistors P7_0, P7_1 and NMOS transistor N7_0 are then all in the on state, allowing one of the first group of analog grayscale voltages VH128 to VH255 to propagate to node Net7_0. Current accordingly flows through the drain electrodes of PMOS transistors P6_0 and P6_1 into the second n-well 150, causing an unwanted variation (rise) in the potential of n-well 150.

In the seventh embodiment, while node H_CNT is at the high level, the timing circuit XI5 turns off PMOS transistor P7_0 and NMOS transistor N7_0. If node H_CNT is driven high for a period T2 as illustrated in FIG. 27 at every transition of the input signals G0 to G7, no current can flow from nodes VH128 to VH255 into the second n-well 150, so the problem of n-well voltage fluctuations caused by such current flow is eliminated.

The second to seventh embodiments can be modified by using trees of NMOS transistors formed in a pair of p-wells as the selection circuits, with a PMOS transistor connected in parallel with one of the NMOS transistors in the first selection circuit. In this case the p-well of the first selection circuit may be biased at the ground level, and the p-well of the first selection circuit may be biased at, for example, the lowest voltage in the first group of analog grayscale voltages.

A few other variations of the embodiments have already been mentioned, but those skilled in the art will recognize that further variations are possible within the scope of the invention, which is defined in the appended claims.

What is claimed is:

1. A decoder circuit having a plurality of grayscale voltage input terminals for receiving respective grayscale voltages, a plurality of digital signal input terminals receiving respective bit signals, and an output terminal, comprising:

a first selection circuit having a plurality of metal-oxide-semiconductor transistors of a first channel type, each having a gate to which one of the bit signals is applied, and a source to which one of the grayscale voltages is applied; and a second selection circuit having a plurality of metal-oxide-semiconductor transistors of a second channel type each having a gate to which one of the bit signals is applied, and a source to which one of the grayscale voltages is applied, wherein the gray scale voltages include positive grayscale voltages higher than a common voltage, and negative grayscale voltages lower than the common voltage; and the grayscale voltages applied to the first selection circuit and the grayscale voltages applied to the second selection circuit are of the same polarity.

2. The decoder circuit of claim 1, wherein an output of the first selection circuit and an output of the second selection circuit are connected to said output terminal.

3. The decoder circuit of claim 1, wherein the transistors in the first selection circuit are connected in a first tree network having the output terminal as a root node and the gray scale voltage input terminals as leaf nodes, and the second selection circuit includes an internal node, and the transistors in the second selection circuit include:

a first plurality of transistors connected in series between the internal node and the output terminal; and a second plurality of transistors interconnected in a second tree network having the internal node as a root node and the grayscale voltage input terminals receiving grayscale voltages in the second group as leaf nodes.

4. A decoder circuit having a plurality of grayscale voltage input terminals for receiving respective grayscale voltages, a plurality of digital signal input terminals receiving respective bit signals, and an output terminal, comprising:

a first selection circuit having a plurality of metal-oxide-semiconductor transistors of a first channel type, each having a gate to which one of the bit signals is applied, and a source to which one of the grayscale voltages is applied; and a second selection circuit having a plurality of metal-oxide-semiconductor transistors of a second channel type each having a gate to which one of the bit signals is applied, and a source to which one of the grayscale voltages is applied, wherein the transistors in the first selection circuit are so connected as to conduct a selected one of the grayscale voltages to the output terminal through the transistors connected in series between the corresponding one of the grayscale voltage input terminals and the output terminal; and the transistors in the second selection circuit are so connected as to conduct a selected one of the grayscale voltages to the output terminal through the transistors connected in series between the corresponding one of the grayscale voltage input terminals and the output terminal.

5. The decoder circuit of claim 4, wherein the number of transistors connected in series between each of the grayscale voltage input terminals and the output terminal is equal to the number of bits forming the digital signal.

6. The decoder circuit of claim 4, wherein an output of the first selection circuit and an output of the second selection circuit are connected to said output terminal.

7. The decoder circuit of claim 4, wherein the transistors in the first selection circuit are connected in a first tree network having the output terminal as a root node and the gray scale voltage input terminals as leaf nodes, and the second selection circuit includes an internal node, and the transistors in the second selection circuit include:

a first plurality of transistors connected in series between the internal node and the output terminal; and a second plurality of transistors interconnected in a second tree network having the internal node as a root node and the grayscale voltage input terminals receiving grayscale voltages in the second group as leaf nodes.

8. A decoder device having a plurality of grayscale voltage input terminals for receiving respective grayscale voltages, a plurality of digital signal input terminals receiving respective bit signals, and an output terminal, the gray scale voltages including positive grayscale voltages higher than a common voltage and negative gray scale voltages lower than the common voltage;

said decoder device including a first decoder circuit for selecting one of the positive gray scale voltages according to the bit signals, and a second decoder circuit for selecting one of the negative gray scale voltages according to the bit signals;

the positive gray scale voltages being divided into a first group and a second group, each of the grayscale voltages in the first group being higher than all of the grayscale voltages in the second group;

the negative gray scale voltages being divided into a third group and a fourth group, each of the grayscale voltages in the third group being lower than all of the grayscale voltages in the fourth group;

said first decoder circuit comprising:

a first selection circuit having a plurality of transistors interconnected to select one of the grayscale voltages in the first group according to the bit signals and conduct the selected grayscale voltage to the output terminal; and a second selection circuit having a plurality of transistors interconnected to select one of the grayscale voltages in the second group responsive to the bit signals and conduct the selected grayscale voltage to the output terminal; and said second decoder circuit comprising:

a third selection circuit having a plurality of transistors interconnected to select one of the grayscale voltages in the third group according to the bit signals and conduct the selected grayscale voltage to the output terminal; and a fourth selection circuit having a plurality of transistors interconnected to select one of the grayscale voltages in the fourth group responsive to the bit signals and conduct the selected grayscale voltage to the output terminal.

9. The decoder device of claim 8, wherein the transistors in the first selection circuit operate in a first substrate biased at a first potential and the transistors in the second selection circuit operate in a second substrate biased at a second potential lower than the first potential; and the transistors in the third selection circuit operate in a third substrate biased at a third potential and the transistors in the fourth selection circuit operate in a fourth substrate biased at a fourth potential higher than the third potential.

* * * * *